United States Patent
Jiang et al.

(10) Patent No.: US 9,499,897 B2
(45) Date of Patent: Nov. 22, 2016

(54) THIN FILM FORMING APPARATUS

(71) Applicant: SHINCRON CO., LTD., Yokohama-shi, Kanagawa (JP)

(72) Inventors: Yousong Jiang, Kanagawa (JP); Ichiro Shiono, Kanagawa (JP); (Continued)

(73) Assignee: SHINCRON CO., LTD., Kanagawa (JP)

(*) Notice: Subject to any disclaimer, the term of this patent is extended or adjusted under 35 U.S.C. 154(b) by 934 days.

(21) Appl. No.: 13/621,337

(22) Filed: Sep. 17, 2012

(65) Prior Publication Data
US 2013/0074767 A1    Mar. 28, 2013

Related U.S. Application Data

(63) Continuation of application No. PCT/JP2011/071649, filed on Sep. 22, 2011.

(30) Foreign Application Priority Data

Apr. 10, 2012  (JP) ................................. 2012-089510

(51) Int. Cl.
*B05C 13/00* (2006.01)
*C23C 14/04* (2006.01)
(Continued)

(52) U.S. Cl.
CPC ........... *C23C 14/042* (2013.01); *C23C 14/505* (2013.01); *C23C 16/042* (2013.01); (Continued)

(58) Field of Classification Search
CPC ................. H01L 21/00; H01L 2223/00; H01L 2924/00; H01L 2925/00; C23C
(Continued)

(56) References Cited

U.S. PATENT DOCUMENTS 3,859,956 A * 1/1975 Paola ...................... C23C 14/50
                                                        118/500
4,449,478 A * 5/1984 Kraus ................... C23C 14/505
                                                        118/504
(Continued)

FOREIGN PATENT DOCUMENTS

EP      2573202 A1 *  9/2012
JP      58005341 U    1/1983
(Continued)

OTHER PUBLICATIONS

Office action dated Dec. 4, 2012 in corresponding Japanese Application 2012-089510.
(Continued)

*Primary Examiner* — Monica Carter
*Assistant Examiner* — Mahdi H Nejad
(74) *Attorney, Agent, or Firm* — Typha IP LLC

(57) ABSTRACT

Provided is a thin film forming apparatus for reducing operation time and cost by forming a film only on a specific portion on substrates. A substrate holding mechanism provided in the apparatus includes: substrate holding members holding substrates in a manner that a part of a non-film forming portion of a substrate overlaps the other substrate and a film forming portion is exposed, a support member supporting the substrate holding members, and a rotation member which rotates the support member. The substrate holding members include: holding surfaces holding the substrates and disposed between a film forming source and the substrates, step portions formed between the holding surfaces in a manner that ends of the substrates respectively contact with the step portions, and opening portions formed on the holding surfaces of the portion corresponding to the film forming portion when the ends of the substrates contact with the step portions.

17 Claims, 15 Drawing Sheets

(72) Inventors: Mitsuhiro Miyauchi, Kanagawa (JP);
Takaaki Aoyama, Kanagawa (JP);
Tatsuya Hayashi, Kanagawa (JP);
Ekishu Nagae, Kanagawa (JP)

(51) Int. Cl.
| | | |
|---|---|---|
| *C23C 16/458* | (2006.01) | |
| *C23C 14/24* | (2006.01) | |
| *C23C 16/04* | (2006.01) | |
| *C23C 14/50* | (2006.01) | |

(52) U.S. Cl.
CPC ........... *C23C 16/4584* (2013.01); *C23C 14/04* (2013.01); *C23C 14/24* (2013.01); *C23C 14/50* (2013.01); *C23C 16/04* (2013.01)

(58) Field of Classification Search
CPC ................... 14/04–14/042;C23C 14/24; C23C 14/50–14/505; C23C 16/04–16/042; C23C 16/458; C23C 16/4582–16/4585
USPC ......... 118/720–721, 726, 728–730, 500, 503
See application file for complete search history.

(56) References Cited

U.S. PATENT DOCUMENTS

| | | | | |
|---|---|---|---|---|
| 6,082,298 | A * | 7/2000 | Suter ........................ | C23C 14/50 118/728 |
| 6,168,832 | B1 * | 1/2001 | Boucher ............... | C23C 14/044 204/192.1 |
| 7,516,536 | B2 * | 4/2009 | Suzuki .................... | B24B 37/26 29/558 |
| 8,020,511 | B2 * | 9/2011 | Chien ................... | C23C 14/505 118/500 |
| 8,048,227 | B2 * | 11/2011 | Tso ........................ | C23C 14/50 118/715 |
| 8,356,808 | B2 * | 1/2013 | Macionczyk ......... | C23C 14/505 269/55 |
| 8,561,276 | B2 * | 10/2013 | Tsai ........................ | C23C 14/34 269/21 |
| 2010/0272893 | A1 * | 10/2010 | Chang ................... | C23C 14/044 427/255.5 |
| 2011/0248437 | A1 * | 10/2011 | Tsai ........................ | B25B 5/06 269/152 |
| 2012/0083050 | A1 * | 4/2012 | Luu ...................... | H01L 21/2855 438/5 |
| 2012/0186522 | A1 * | 7/2012 | Adachi ................... | C23C 14/24 118/726 |

FOREIGN PATENT DOCUMENTS

| | | | |
|---|---|---|---|
| JP | 60194077 A | | 10/1985 |
| JP | 63-266071 | * | 4/1987 |
| JP | 63-266071 | * | 2/1988 |
| JP | 63266071 A | | 11/1988 |
| JP | 05279851 A | | 10/1993 |
| JP | 0669266 U | | 9/1994 |
| JP | 0734222 A | | 2/1995 |
| JP | 2002198413 A | | 7/2002 |
| JP | 2006330411 A | | 12/2006 |
| JP | 201217511 | * | 1/2012 |
| JP | 201217511 A | | 1/2012 |
| JP | 2012017511 A | * | 1/2012 |
| WO | 2010018639 A1 | | 2/2010 |
| WO | WO2013042247 A1 | * | 3/2013 |

OTHER PUBLICATIONS

International Search Report in the corresponding International Patent Application No. PCT/JP2011/071649 issued Dec. 6, 2011.
The Extended European Search Report issued Jan. 17, 2013 in corresponding European Patent Application.

* cited by examiner

THIN FILM FORMING APPARATUS

CROSS REFERENCE TO RELATED APPLICATIONS

This application is based upon and claims the benefit of priority from PCT International Application PCT/JP2011/071649, filed on Sep. 22, 2011, and the prior Japanese Patent Application No. 2012-089510, filed on Apr. 10, 2012, the entire contents of which are incorporated herein by reference.

BACKGROUND OF THE INVENTION

1. Field of the Invention

The present invention relates to a thin film forming apparatus, and particularly, to a thin film forming apparatus capable of efficiently forming a thin film on specific portions on multiple substrates.

2. Description of the Related Art

In various apparatuses such as a portable game machine, a smart phone, a cellular phone, and filming equipment like a digital camera or a digital video, a technique for forming a thin film on a surface of a substrate is used.

Then, in the substrate which is provided in such apparatuses, a thin film may be formed on the entire surface of the substrate, but may selectively be formed only on a specific region on the substrate in many cases.

In this way, in order to selectively form a thin film only on a specific region on the substrate, a technique for covering a portion on which a thin film is not to be formed (hereinafter, referred to as a "non-film forming portion") with a mask is used in the substrate which is held by a substrate holding mechanism disposed inside a thin film forming apparatus. However, in the technique for covering the substrate with a mask in this way, only a limited number of substrates may be held by the substrate holding mechanism since the respective substrates are generally held by the substrate holding mechanism so as not to overlap a portion on which a thin film is to be formed (hereinafter, referred to as a "film forming portion") on the substrate. Accordingly, there are problems that films may not simultaneously be formed on a plurality of substrates, and hence the film forming efficiency is degraded.

In order to solve the above-described problems, there is proposed a technique for forming a thin film in the state where the substrates overlap each other so as to cover the non-film forming portion by the other substrate instead of forming the non-film forming portion using a mask (JP 1988-266071A).

Further, JP 1995-34222A proposes a technique for disposing a plurality of substrates in an inclined state using first and second pins to form a thin film near ends of the substrates. In this way, in the substrates arranged in an inclined state, since the substrates serve as a mask therebetween, there is no need to provide a mask for the film forming operation. Furthermore, since the substrates are arranged so as to overlap each other, a large number of substrates may simultaneously be processed.

However, in the technique disclosed in JP 1988-266071A, there is a need to attach an attachment preventing plate which covers the non-film forming portion onto the substrate which is finally placed on the substrate holder, which degrades the operation efficiency. Further, in the technique disclosed in JP 1995-34222A, there is a need to lock the substrate to the first and second pins, which causes problems that the operation of installing the substrate is troublesome and the longer operation time is needed.

Accordingly, in the techniques of JP 1988-266071A and JP 1995-34222A, the more operation time is needed for the film forming operation, which increases a problem that cost for the film forming operation.

Further, in the substrate holding mechanism disclosed in JP 1988-266071A and JP 1995-34222A, the end (the end including the side surface) of the substrate is inevitably exposed, and hence it is difficult to precisely set the shape or the size of the film forming portion. Accordingly, there is a problem that the shape or the size of the film forming portion which can be formed on the substrate is limited.

SUMMARY OF THE INVENTION

The present invention provides a thin film forming apparatus that enables operation time reduction for thin film formation and cost decrease for the film forming operation by efficiently simplifying an operation of forming a thin film only on a specific portion on a plurality of substrates.

Further, the present invention further provides a thin film forming apparatus capable of precisely setting a shape or a size of a film forming portion when forming the film forming portion only on a specific portion on a substrate.

According to the present invention, the above-described problems are solved by a thin film forming apparatus which includes a substrate holding mechanism holding a plurality of substrates to form a thin film on each of the plurality of substrates; in which the substrate holding mechanism includes a substrate holding member which holds the plurality of substrates, a support member which supports the substrate holding member, and a rotation member which rotates the support member; in which the substrate holding member includes a plurality of holding surfaces which holds the plurality of substrates and is disposed between a film forming source emitting a material of the thin film and the plurality of substrates, a plurality of step portions which is formed between the plurality of holding surfaces, and a plurality of opening portions each of which is formed in each of the plurality of holding surfaces; and in which when the ends of the plurality of substrates respectively come into contact with the step portions in the state where a part of a non-film forming portion on which a thin film is not to be formed in each of the plurality of substrates overlaps the other substrate and a film forming portion on which a thin film is not to be formed is exposed, the plurality of substrates may be loaded in a manner that the film forming portion is exposed to the film forming source through the opening portion.

In order to improve the efficiency of the technique for forming a thin film only on a specific portion on a substrate, in the related art, the film forming operation is performed in the state where substrates are held in an overlapping state in a manner that a non-film forming portion of one substrate is overlapped by the other substrate. In this case, there is a need to perform a troublesome operation in which the non-film forming portion is disposed so as to be covered by the other substrate and the substrate is held so as to expose the film forming portion.

In order to handle the problem, according to the thin film forming apparatus of the present invention, a plurality of substrates may easily be held by the substrate holding mechanism just by causing the substrate to come into contact with (just by placing the substrate on) the step portion and the holding surface holding the substrate. Further, since the holding surface of the substrate holding mechanism is provided between the film forming source and the substrate and the holding surface is provided with the opening portion in a portion corresponding to the film forming portion, only the film forming portion of the substrate is exposed, and hence a complex attachment operation does not need to be performed. That is, it is possible to simplify an operation in which the substrate is held in a manner that the non-film forming portion of one substrate is covered by the other substrate and the film forming portion is exposed. Accordingly, since there is no need to perform a complex operation when holding the substrate, the efficiency may be improved. As a result, operation time for film formation may be shortened, and cost for film forming operation may be decreased.

Further, since only the film forming portion of the substrate may be exposed by providing the opening portion in the holding surface, the holding surface (the substrate holding member) serves as a mask. Accordingly, since the shape or the size of the film forming portion may be controlled in accordance with the shape or the size of the opening portion, the film forming operation may further precisely be performed.

Furthermore, since the substrate holding member may also be rotated by further providing the rotation member which rotates the support member (that is, the substrate holding mechanism) in the substrate holding mechanism, the thin films which are formed on the plurality of substrates may be formed in a uniform film quality and thickness.

In this case, the substrate holding member may be divided into two to twelve segments in the rotation direction of the rotation member.

When the substrate holding member is divided into two to twelve segments in the rotation direction of the substrate holding mechanism, the substrate holding member may become an appropriate size and thus easily be attached to the support member. Accordingly, the operation efficiency of the film forming operation may be improved and the operation time may be shortened.

Further, the substrate holding member may be formed in an annular shape in the plan view, and the plurality of substrate holding members may be disposed so as to be adjacent to each other in the radial direction of the substrate holding member.

In this way, when the plurality of annular (donut-shaped) substrate holding members are provided adjacent to each other in the radial direction, a larger number of substrates may be held by the substrate holding mechanism. Accordingly, since thin films may simultaneously be formed with a larger number of substrates, the efficiency of the film forming operation is significantly improved.

Further, the support member may hold the substrate holding member in a manner that an angle formed between the plurality of holding surfaces of the substrate holding member and a rotation axis of the rotation member is adjustable.

In the substrate holding member, the film thickness of the thin film formed on the substrate may be corrected by adjusting the angle formed between the horizontal plane and the holding surface holding the substrate. As a result, the thin film may be formed in a further uniform film thickness on the plurality of substrates, and the material necessary for the film formation may be decreased.

In this case, the substrate holding member may hold the plurality of substrates in a manner that an angle formed between a first imaginary line passing the film forming portion and the film forming source and a perpendicular line with respect to a film forming surface of the film forming portion is 0° to 45°, inclusive.

The thickness (the film thickness) of the thin film when forming the thin film on the substrate depends on the relative position between the film forming surface and the film forming source emitting the thin film material. More specifically, the film thickness depends on the angle in which the thin film material incidents on the film forming surface from the film forming source.

Accordingly, when the angle in which the thin film material is applied from the film forming source to the film forming surface, that is, the angle which is formed between the imaginary line passing the film forming surface of the substrate and the film forming source and the perpendicular line with respect to the film forming surface is set to the above-described range, the thickness of the thin film formed on the substrate may easily be controlled, and the thin film may be formed in a further uniform film thickness on the plurality of substrates.

Further, the support member may support the substrate holding member in a manner that the plurality of opening portions formed in the plurality of holding surfaces is positioned on an imaginary dome surface in which the rotation axis of the rotation member serves as a central axis.

In this way, the opening portions which are formed in the substrate holding member are arranged so as to be positioned on the imaginary dome surface in which the rotation axis of the rotation member (that is, the rotation axis of the substrate holding mechanism) serves as the central axis, thus the thin film may be formed in a further uniform film thickness on the plurality of substrates.

Further, the substrate holding members which are arranged so as to be adjacent to each other in the radial direction may be arranged at positions where the opening portion formed in one substrate holding member with respect to the film forming source is not shielded by the other substrate holding member.

In this way, the annular substrate holding members which are arranged adjacent to each other in the radial direction are arranged in a manner that the opening portion provided in the substrate holding member is exposed to the film forming source. In the substrate holding mechanism in which the annular substrate holding members are arranged adjacent to each other in the radial direction, the thickness of the thin film to be formed on the substrate may easily be influenced by the substrate holding members arranged adjacent to each other. Accordingly, since the opening portion provided in one substrate holding member is provided at a position where the opening portion with respect to the film forming source is not shielded by the other substrate holding member, the thickness of the thin film to be formed on the substrate will not easily be influenced by the substrate holding member, and hence the film may be made in a further uniform thickness.

Further, the support member may support the plurality of substrate holding members formed in an annular shape in the plan view and arranged in at least any one of the rotation direction and the radial direction. The substrate holding members which are arranged so as to be adjacent to each other in the radial direction may be disposed at positions where the radial end of one substrate holding member is away by 20 mm or more from a secondary imaginary line passing the film forming source and the outer periphery of the opening portion formed in the holding surface of the other substrate holding member.

In the substrate holding mechanism in which the annular substrate holding members are arranged so as to be adjacent to each other in at least the rotation direction or the radial direction, the thickness of the thin film formed on the substrate may easily be influenced by the substrate holding members arranged adjacent to each other. Accordingly, when the opening portion of one substrate holding member is disposed at a position away by 20 mm or more from the end of the other substrate holding member in at least the rotation direction or the radial direction, the thickness of the formed thin film will not easily be influenced by the substrate holding member, and hence the film may be made in a further uniform thickness.

In this case, the plurality of step portions may be formed in an inclined direction with respect to the radial direction. The plurality of substrates may be formed as a rectangular plate, and when the lengths of inner radial edges of the plurality of substrates are respectively denoted by L and the distance from the center points of the respective edges of the plurality of substrates to the rotation axis of the rotation member are denoted by r, the substrate holding member may hold the plurality of substrates in a manner that the value of (L/2)/r is 0.05 to 0.75, inclusive.

In this way, when the substrate holding member has the above-described configuration particularly in the case where the substrate on which a thin film formed has a rectangular shape, a larger number of substrates may be held by the substrate holding member. Accordingly, since thin films may simultaneously be formed with a larger number of substrates, the efficiency of the film forming operation is significantly improved.

Further, the substrate holding member may hold the plurality of substrates in a manner that an angle formed between the edge of one substrate and the edge of the other substrate in the plurality of substrates overlapping each other is 0° to 90°, inclusive.

In this way, when the rectangular substrate is held by the substrate holding member in the above-described positional relation, a larger number of substrates may be held by the substrate holding member. Accordingly, since films may simultaneously be formed with a larger number of substrates, the efficiency of the film forming operation is significantly improved.

Furthermore, the heights of the plurality of step portions may be formed so as to be higher by 0.05 mm or more than the thicknesses of the plurality of substrates.

In this way, when the height of the step portion coming into contact with the edge of the substrate is formed so as to be higher by 0.05 mm or more than the thickness of the substrate, the damage on the surface of the substrate may be inhibited when the substrates are overlapped each other. Accordingly, the substrate may be produced with a thin film in an enhanced quality.

According to the thin film forming apparatus of the present invention, a plurality of substrates may easily be held without a complex operation on a substrate holding member. Accordingly, since there is no need to perform a complex operation for holding a substrate, the film forming operation may efficiently be performed. As a result, operation time for the thin film forming operation may be shortened, and cost for the film forming operation may be decreased. Further, since the thin film forming apparatus of the present invention may hold multiple substrates on the substrate holding member, films may simultaneously be formed with a larger number of substrates, and hence the efficiency of the film forming operation is further improved.

Further, since a holding surface of the substrate holding member of the substrate holding mechanism is provided with an opening portion through which a film forming portion is exposed, the holding surface (the substrate holding member) serves as a mask. Accordingly, since the shape or the size of the film forming portion may be controlled in accordance with the shape or the size of the opening portion, the film forming operation may further precisely be performed.

Furthermore, in the thin film forming apparatus of the present invention, since the substrate holding member provided in the substrate holding mechanism is configured as described above, a thin film may be formed in further uniform film thickness. As a result, the materials necessary for the film forming operation may be reduced.

DETAILED DESCRIPTION OF THE INVENTION

Figure 1:
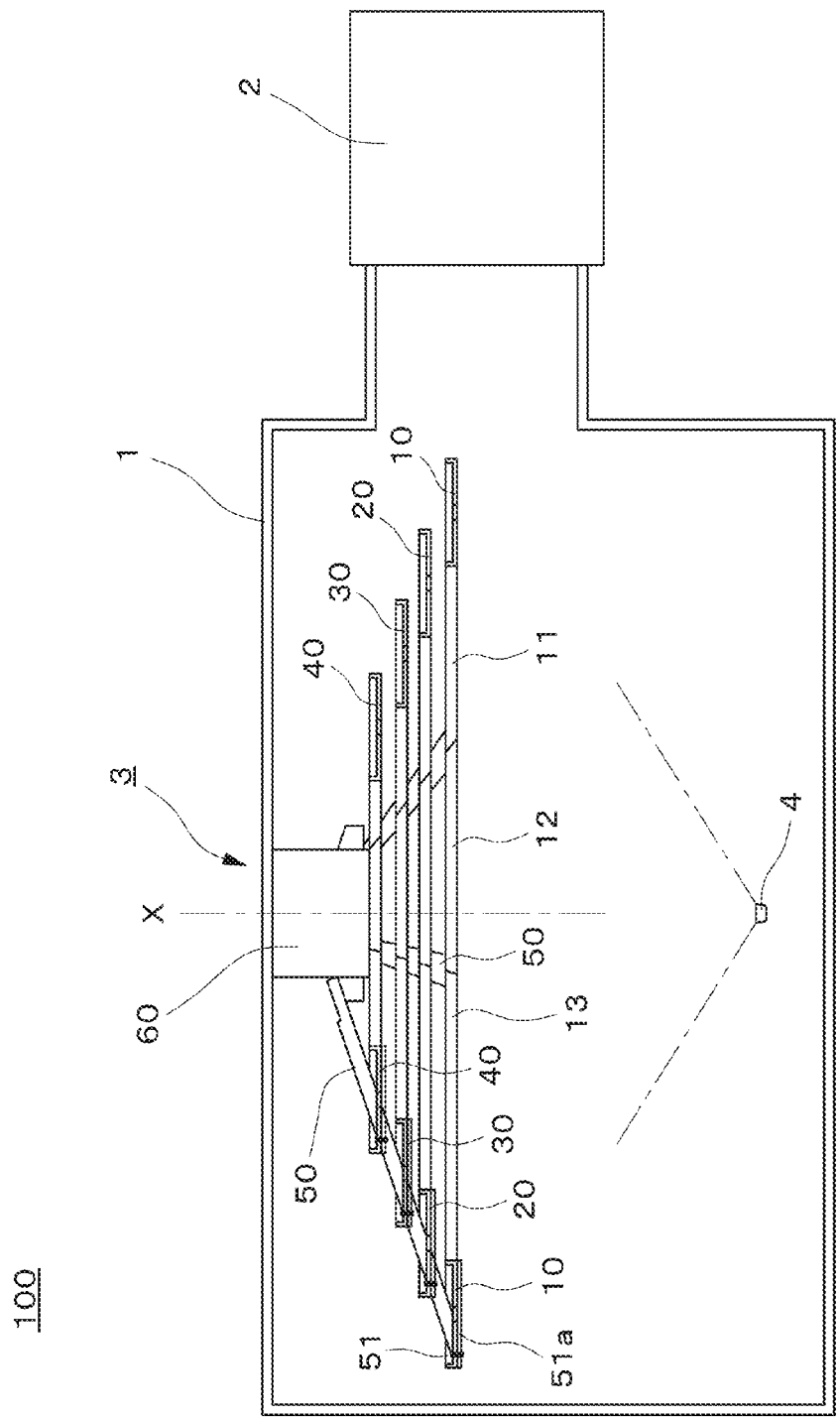
FIG. 1 is a schematic diagram illustrating a thin film forming apparatus according to an embodiment of the present invention.

Hereinafter, an embodiment of the present invention will be described by referring to the drawings. Furthermore, the member, the arrangement, and the like described below will not limit the scope of the invention, and of course, may variously be modified without departing from the spirit of the invention.

Figure 2:
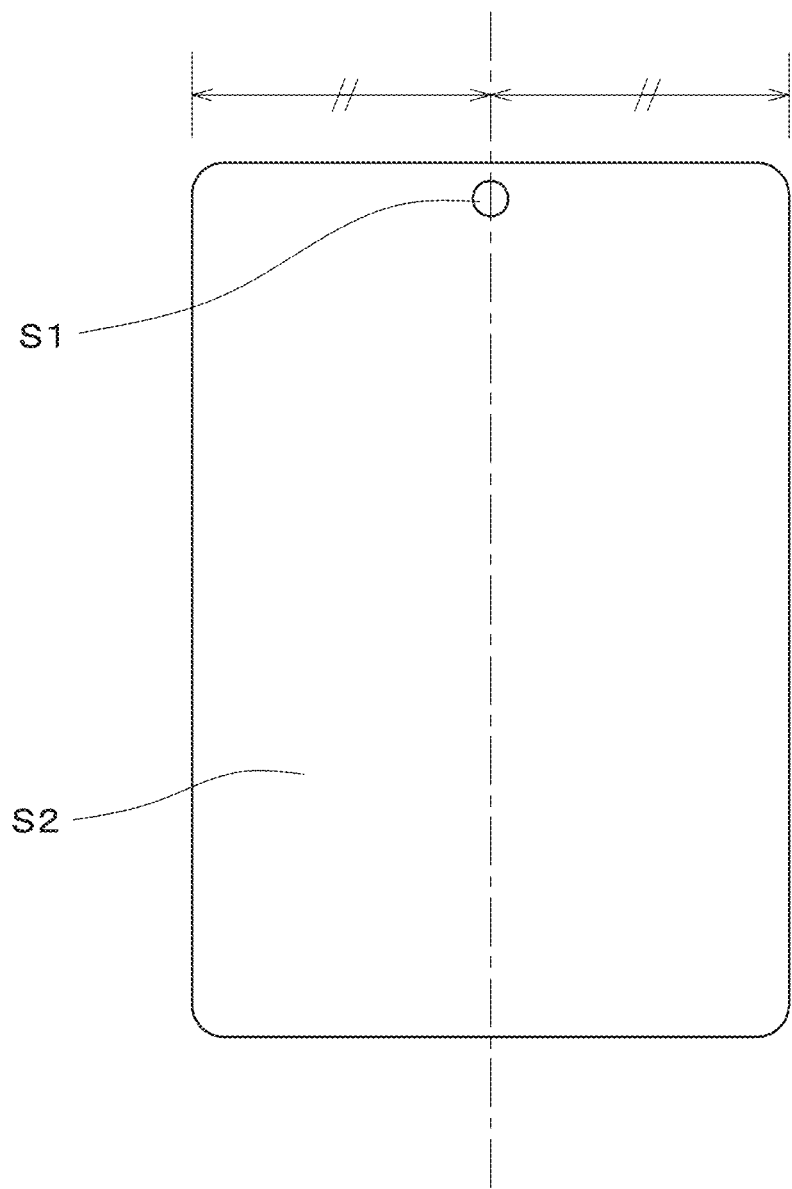
FIG. 2 is a plan view illustrating a substrate which is held by a substrate holding mechanism according to the embodiment of the present invention.
Figure 3:
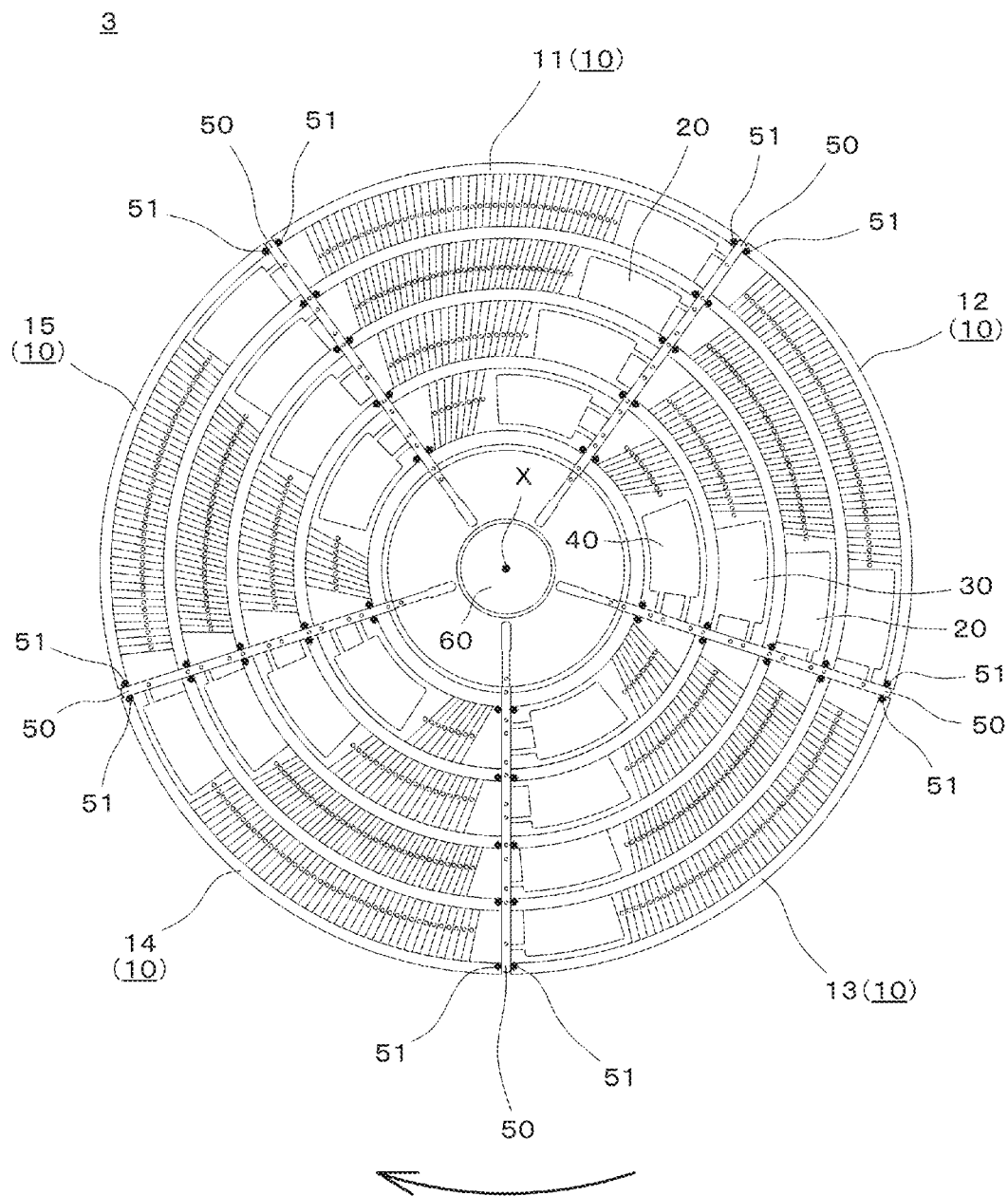
FIG. 3 is a plan view illustrating the substrate holding mechanism according to the embodiment of the present invention.
Figure 4:
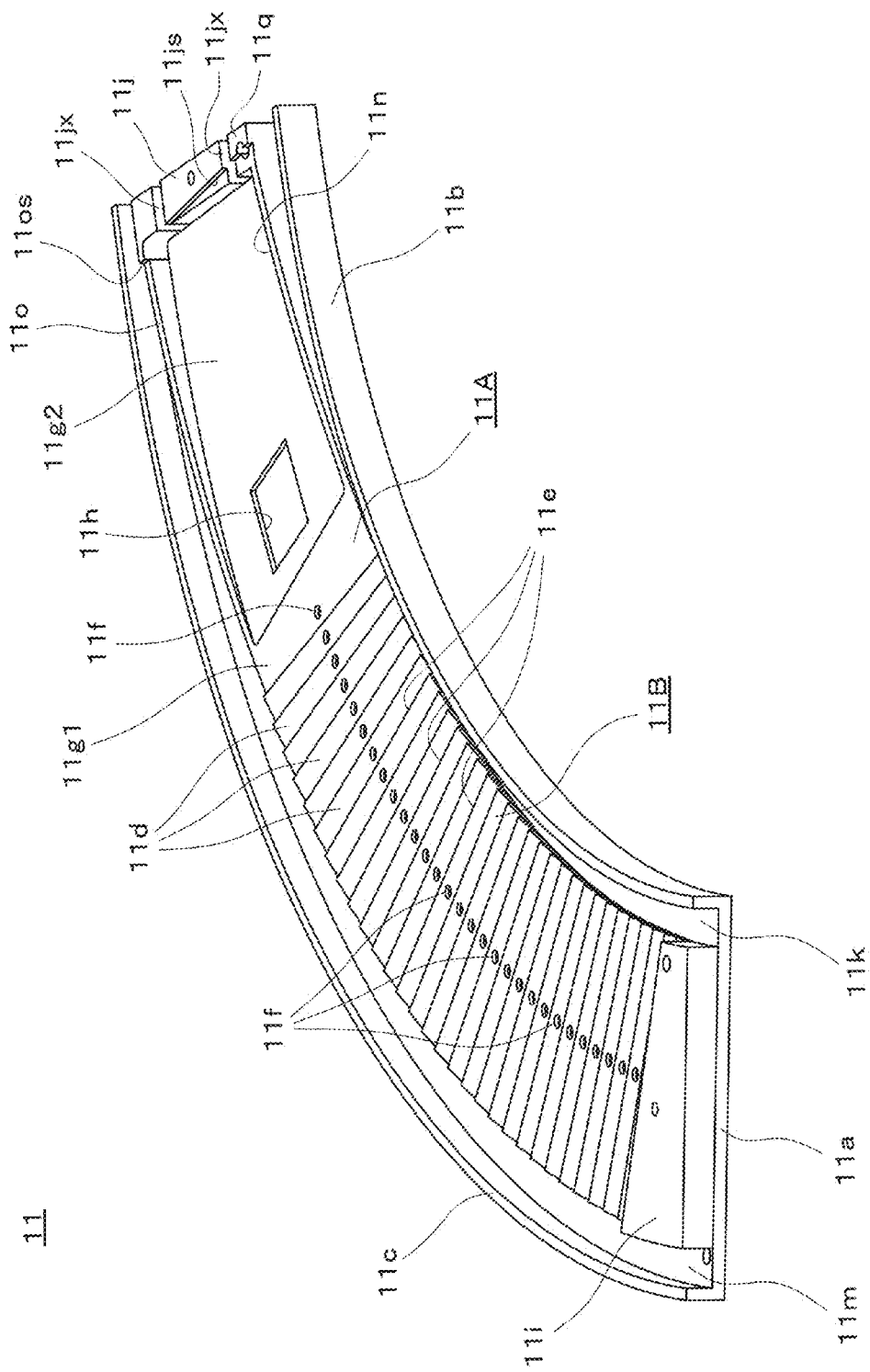
FIG. 4 is a perspective view illustrating a holding jig which constitutes a substrate holding member according to an embodiment of the present invention.
Figure 5:
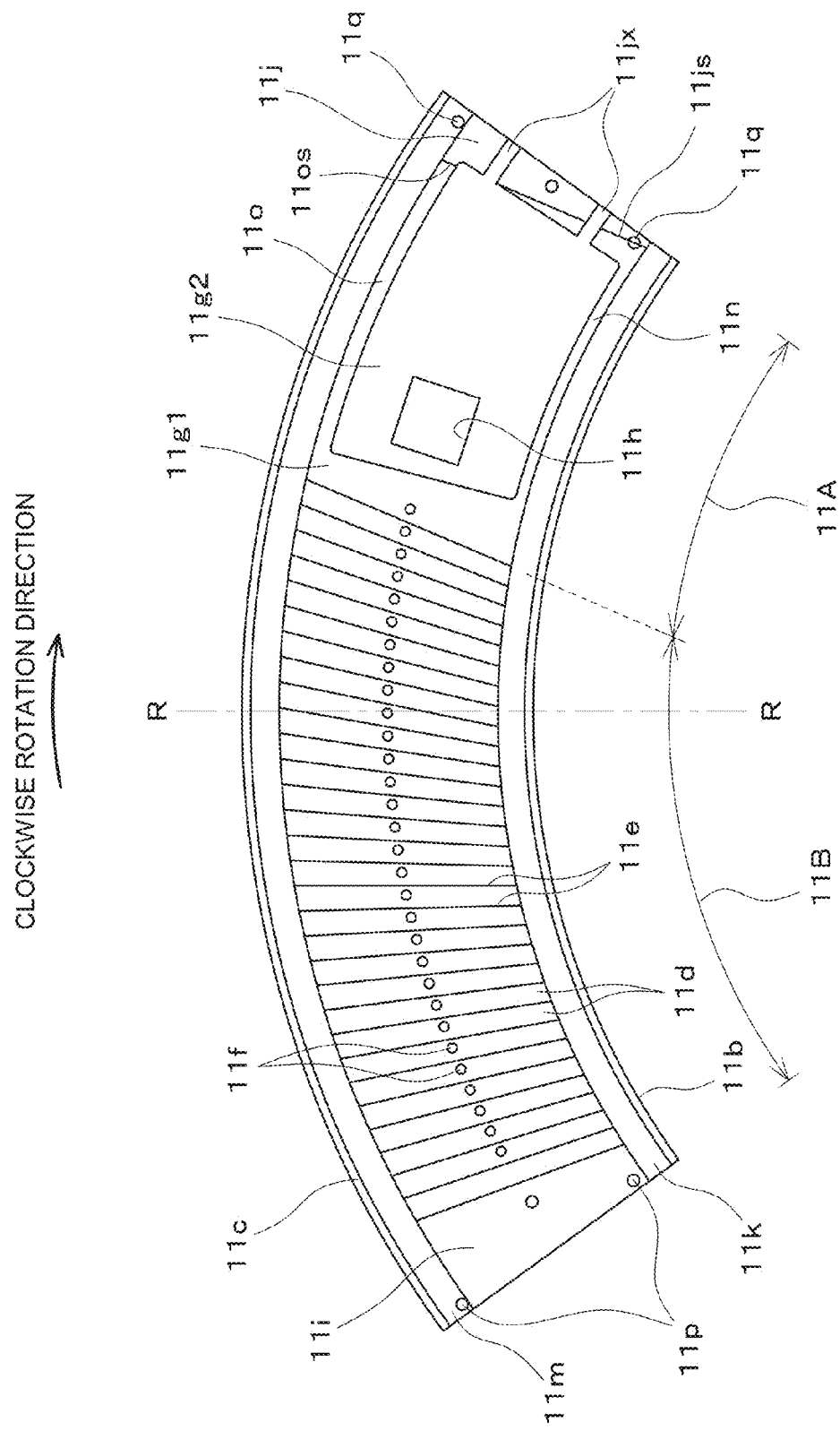
FIG. 5 is a plan view illustrating the holding jig.
Figure 6:
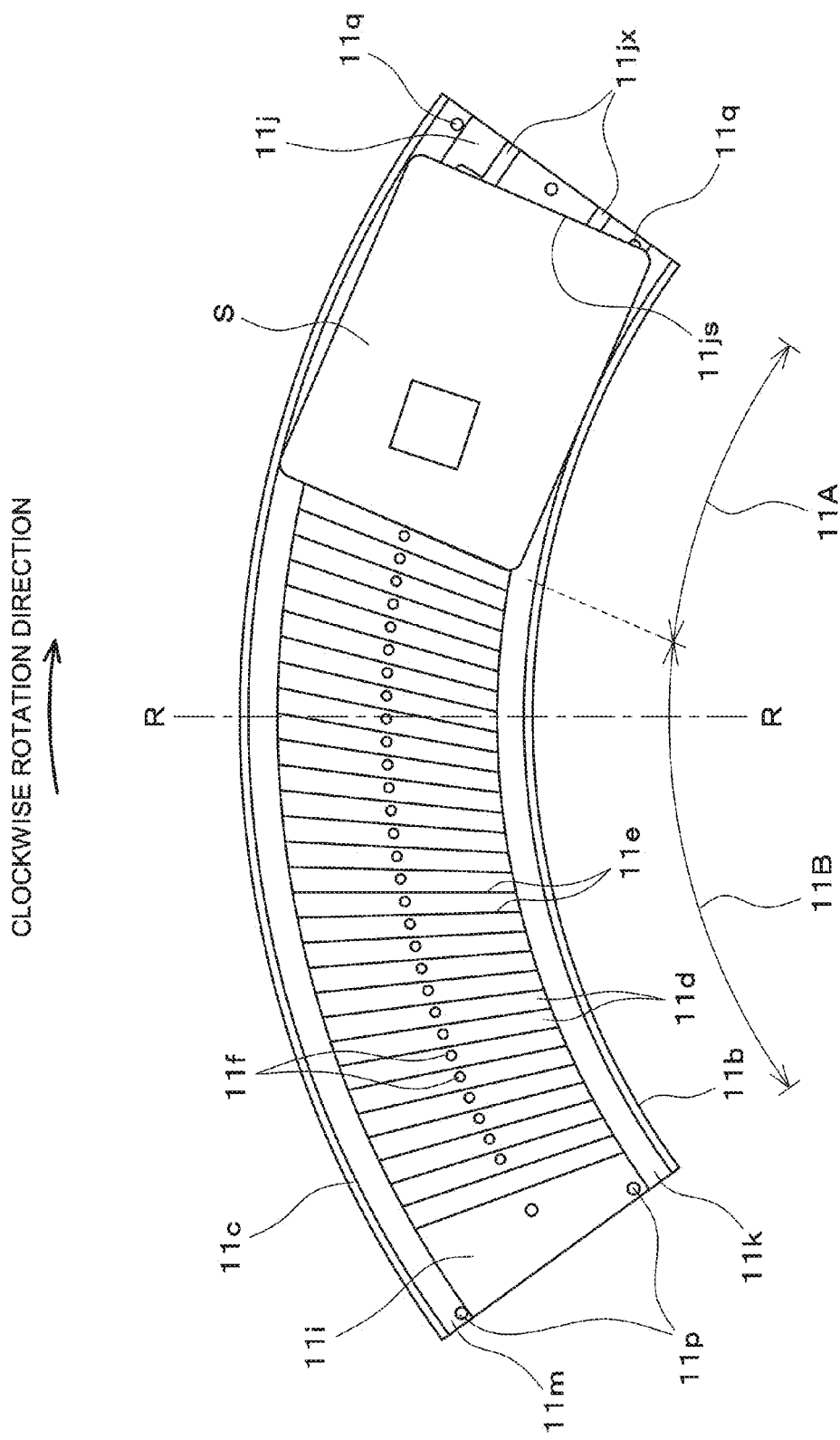
FIG. 6 is a plan view illustrating a state where the first substrate is placed on the holding jig.
Figure 7:
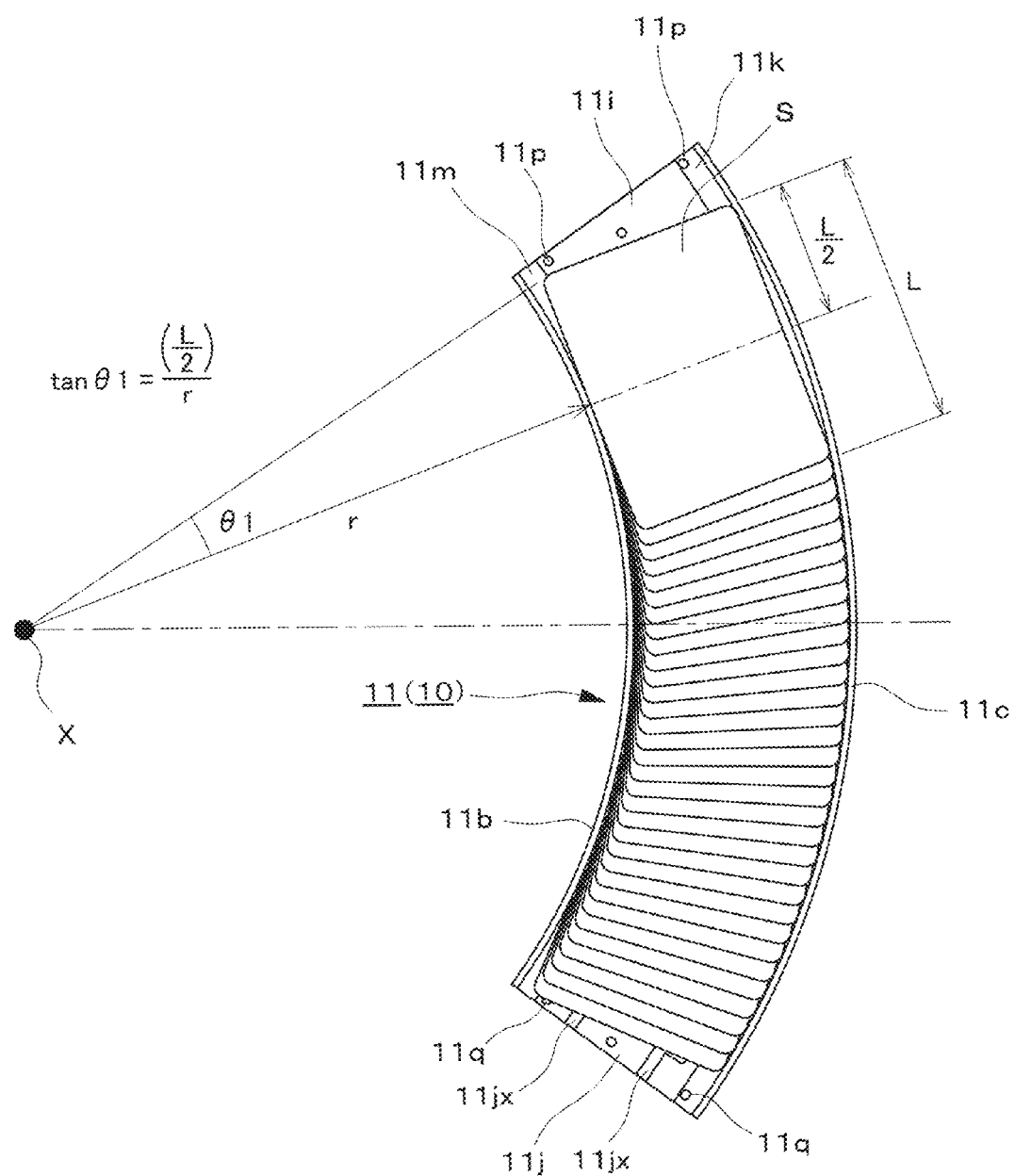
FIG. 7 is a plan view illustrating a state where all substrates are placed on the holding jig.
Figure 8:
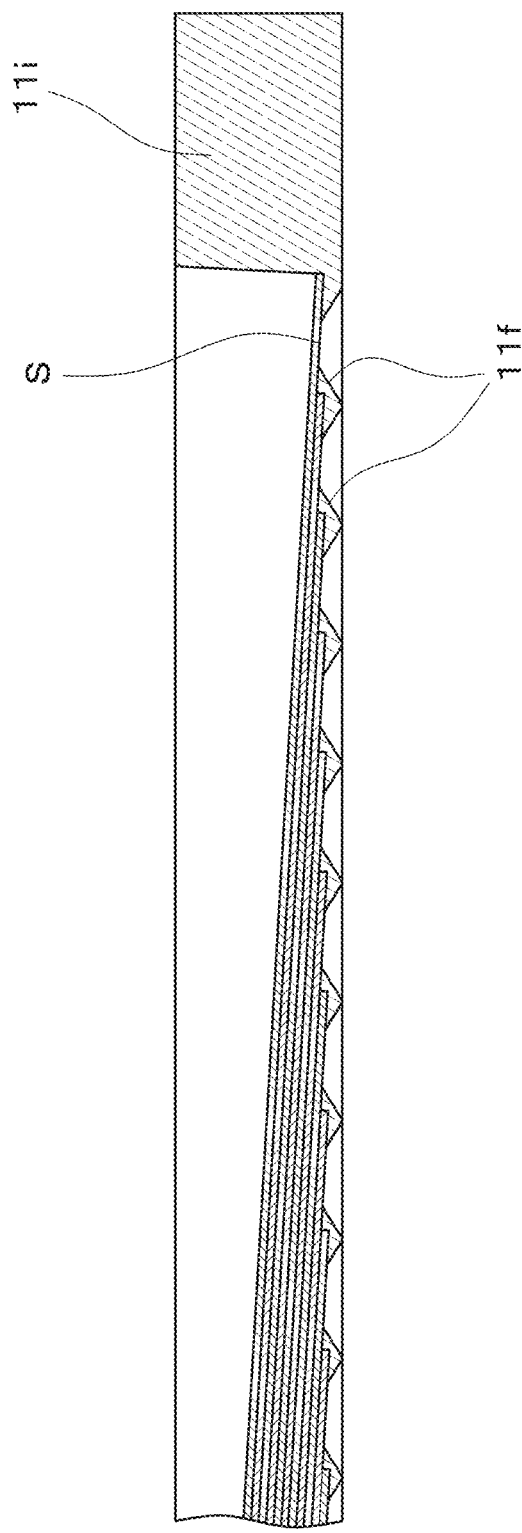
FIG. 8 is a cross-sectional view illustrating a state where the substrate is placed on the holding jig.
Figure 9:
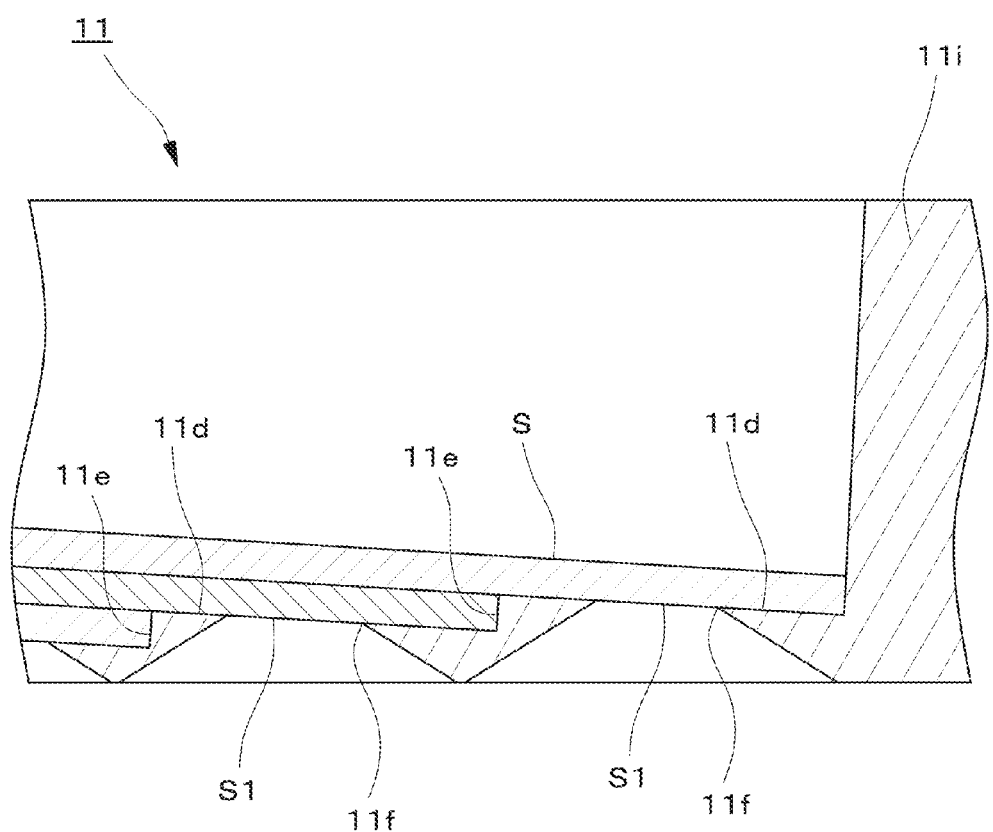
FIG. 9 is a cross-sectional view illustrating a state where the substrate is placed on the holding jig.
Figure 10:
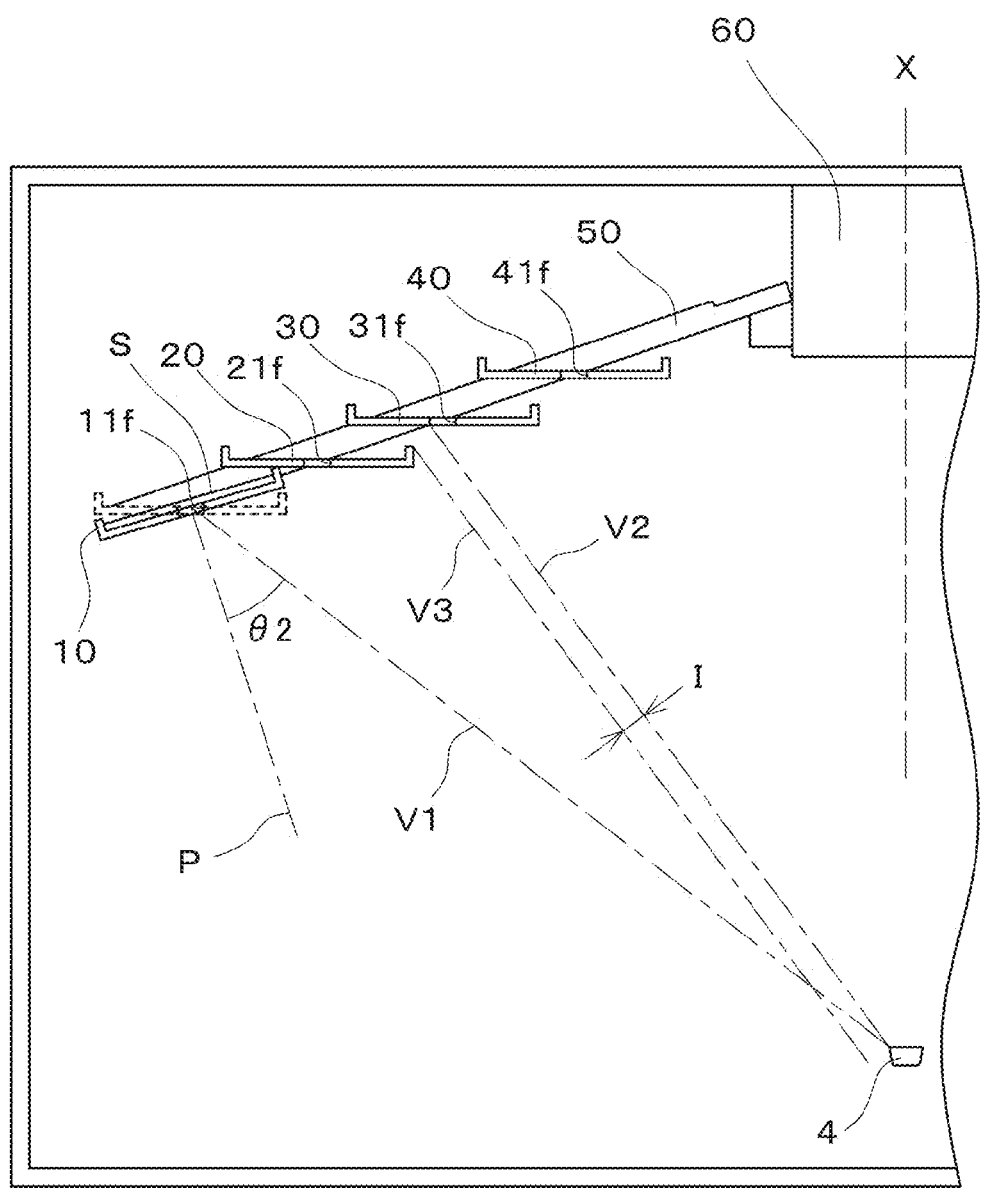
FIG. 10 is a diagram illustrating a positional relation between a film forming source and a support member to which a substrate holding member according to the embodiment of the present invention is fixed.
Figure 11:
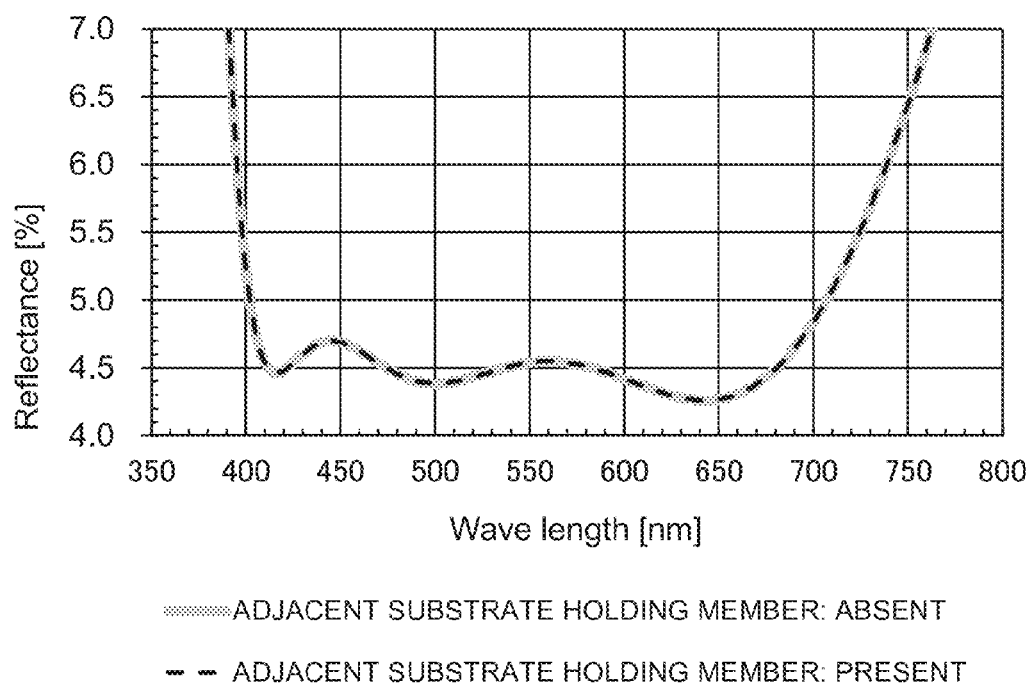
FIG. 11 is a graph illustrating reflectance of a reflection preventing film according to Example 1 of the present invention.
Figure 12:
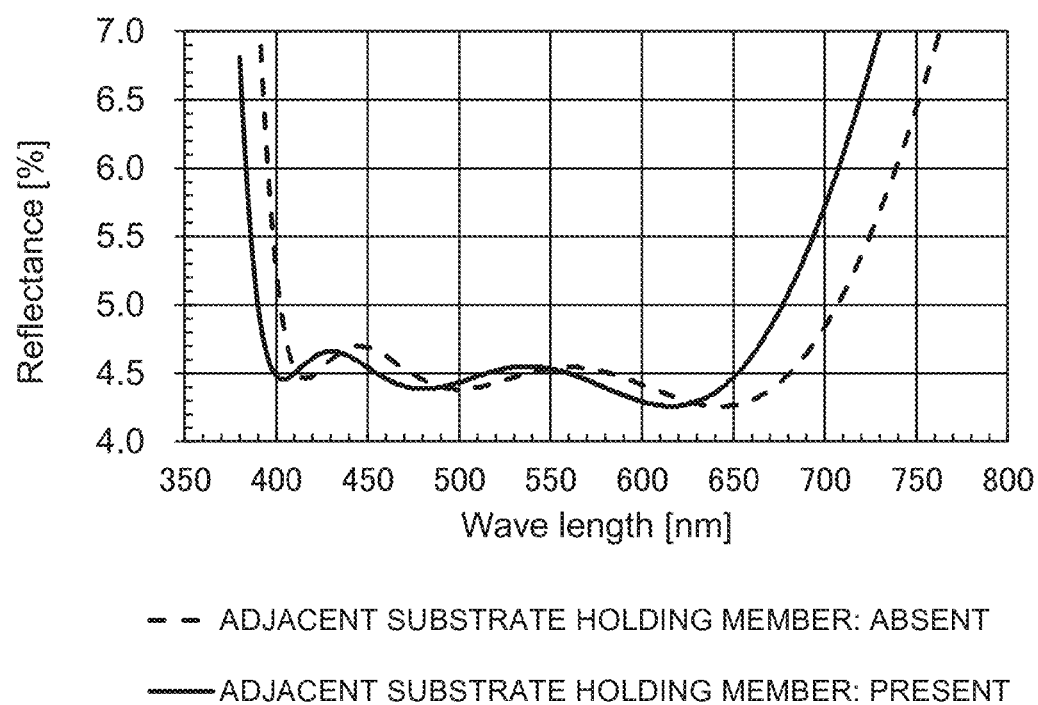
FIG. 12 is a graph illustrating reflectance of a reflection preventing film according to Comparative Example 1 of the present invention.
Figure 13:
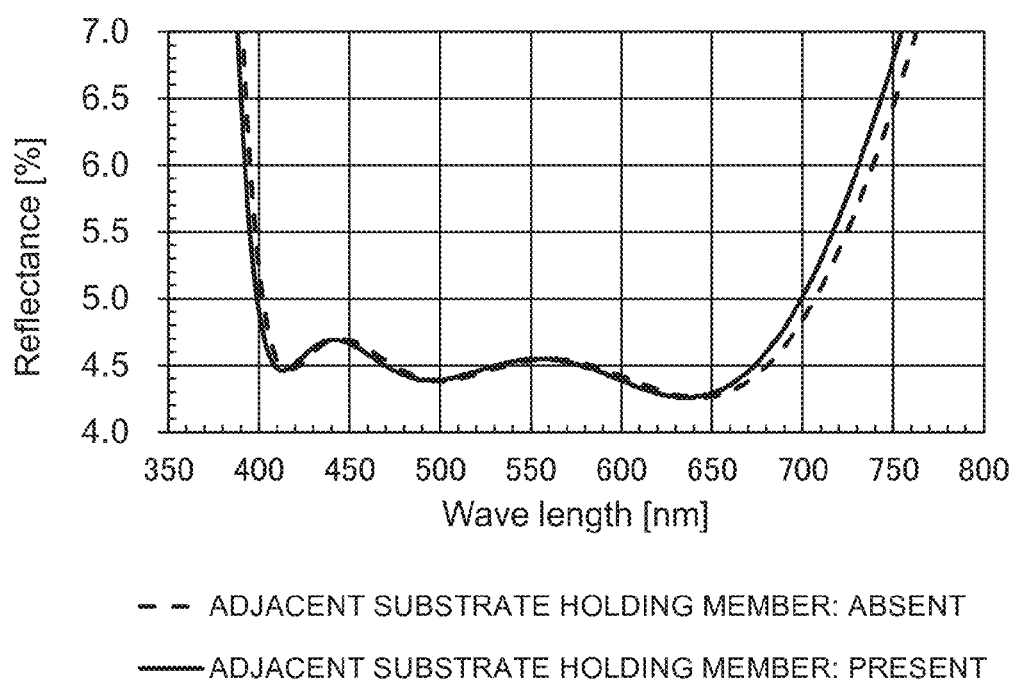
FIG. 13 is a graph illustrating reflectance of a reflection preventing film according to Comparative Example 2 of the present invention.
Figure 14:
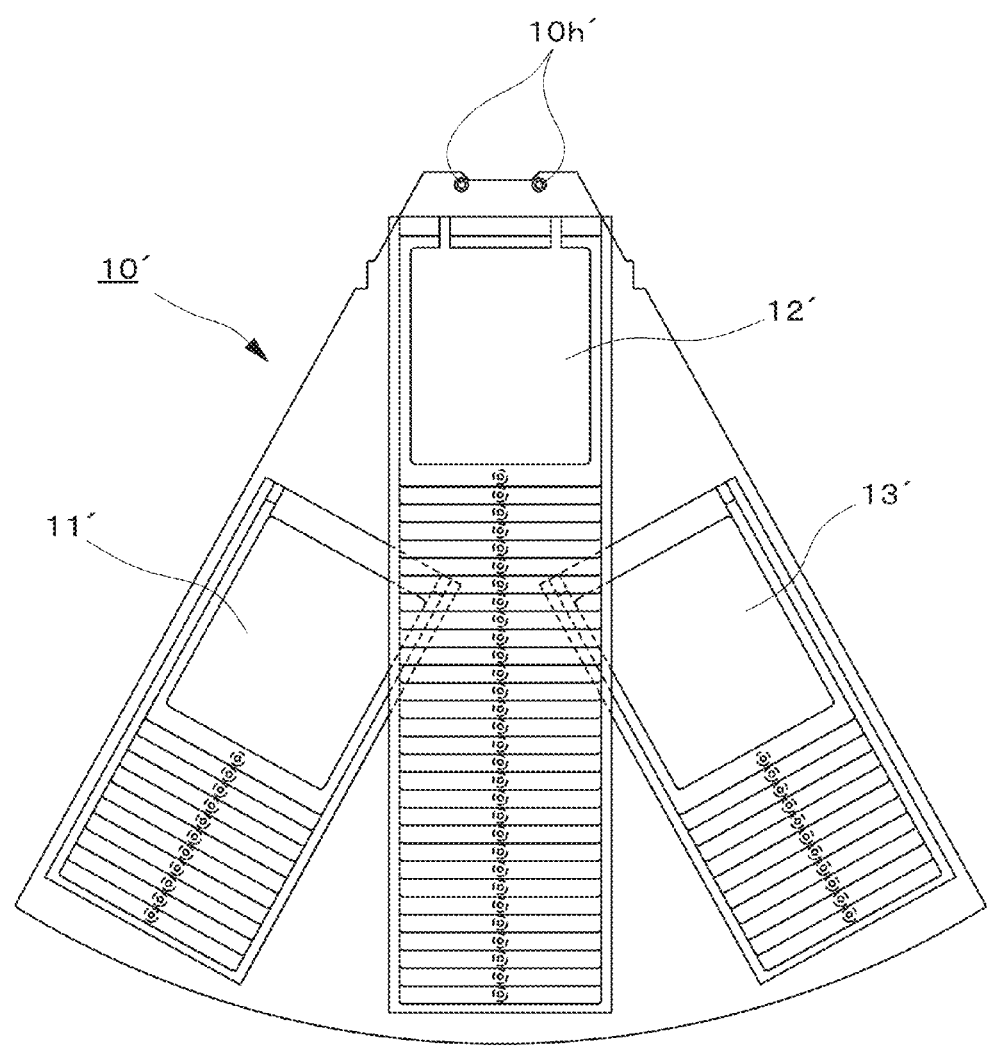
FIG. 14 is a diagram illustrating a substrate holding member according to the other embodiment of the present invention.
Figure 15:
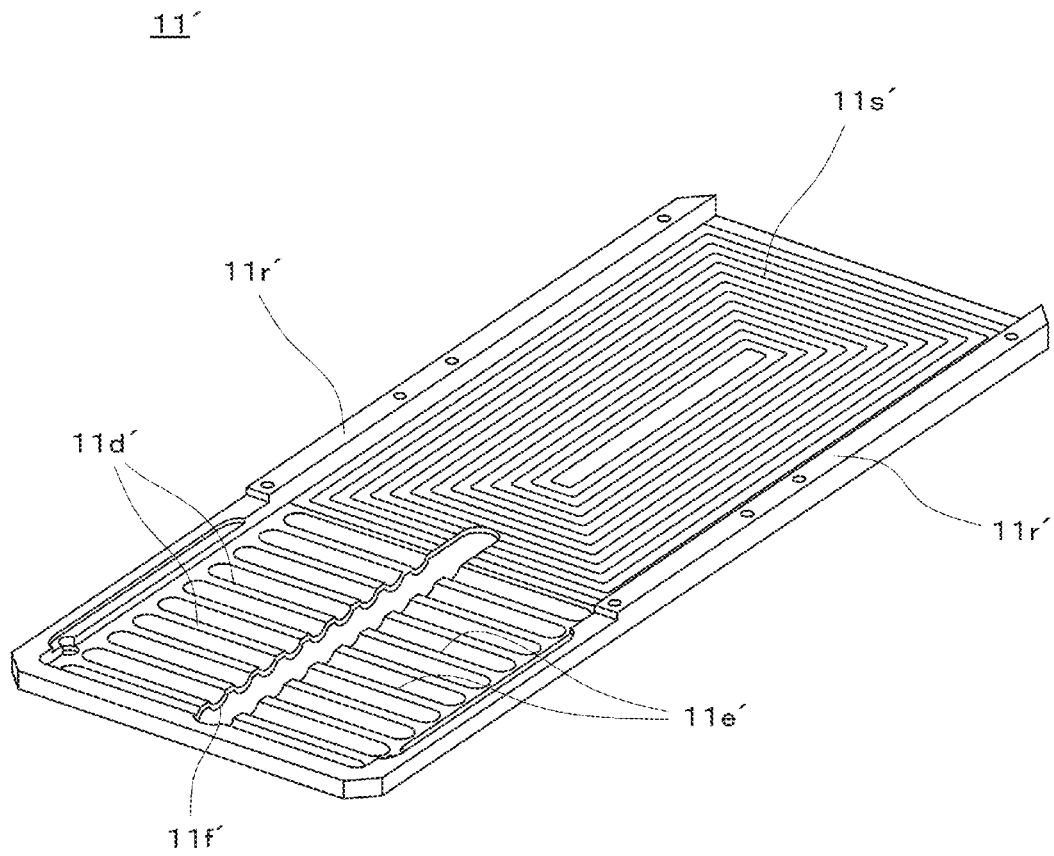
FIG. 15 is a perspective view illustrating the substrate holding member according to the other embodiment of the present invention.

FIGS. 1 to 13 are diagrams according to an embodiment of the present invention. FIG. 1 is a schematic diagram illustrating a thin film forming apparatus. FIG. 2 is a plan view illustrating a substrate which is held by a substrate holding mechanism. FIG. 3 is a plan view illustrating the substrate holding mechanism. FIG. 4 is a perspective view illustrating a holding jig which constitutes the substrate holding mechanism according to an embodiment of the present invention. FIG. 5 is a plan view illustrating the holding jig. FIG. 6 is a plan view illustrating a state where the first substrate is placed on the holding jig. FIG. 7 is a plan view illustrating a state where all substrates are placed on the holding jig. FIG. 8 is a cross-sectional view illustrating a state where the substrate is placed on the holding jig. FIG. 9 is a cross-sectional view illustrating a state where the substrate is placed on the holding jig. FIG. 10 is a diagram illustrating a positional relation between a film forming source and a support member to which a substrate holding member according to the embodiment of the present invention is fixed. FIG. 11 is a graph illustrating reflectance of a reflection preventing film according to Example 1 of the present invention. FIG. 12 is a graph illustrating reflectance of a reflection preventing film according to Comparative Example 1 of the present invention. FIG. 13 is a graph illustrating reflectance of a reflection preventing film according to Comparative Example 2 of the present invention. FIGS. 14 and 15 are diagrams according to the other embodiment of the present invention. FIG. 14 is a diagram illustrating a substrate holding member, and FIG. 15 is a perspective view illustrating the substrate holding member.

A substrate holding mechanism 3 which is a characteristic element of the present invention is provided in a thin film forming apparatus 100 so as to simultaneously form a thin film on each of a plurality of substrates S. In the substrate S, a thin film is not formed on the entire surface thereof, and a thin film is formed only in a specific region. Accordingly, there are provided a film forming portion S1 and a non-film forming portion S2 on which no thin film is to be formed. The substrate holding mechanism 3 has the following configuration so as to simultaneously process a large number of substrates S when forming a thin film on the substrate S including the film forming portion S1 and the non-film forming portion S2.

<Structure of Thin Film Forming Apparatus>

The thin film forming apparatus 100 of FIG. 1 is a vacuum depositing apparatus which forms a thin film on the surface of the substrate S, and FIG. 1 is a schematic cross-sectional view illustrating a part of the thin film forming apparatus 100.

The thin film forming apparatus 100 is used to form a thin film on the surface of the substrate S by a thin film material in a manner such that the inside of a vacuum container 1 is made in a vacuum state and a thin film material such as metal is heated and evaporated. The thin film forming apparatus 100 includes the vacuum container 1, a substrate holding mechanism 3, and a film forming source 4.

The vacuum container 1 is a substantially cylindrical hollow container which is made of a known metal material such as aluminum or stainless steel and forms a thin film on the substrate S therein. A vacuum pump 2 is connected to the vacuum container 1, and the inside of the vacuum container 1 may be made to be a vacuum state of about $1 \times 10^{-2}$ to $1 \times 10^{-5}$ Pa. The vacuum container 1 is provided with a gas introduction pipe (not illustrated) which introduces a gas thereinto and a pressure gauge (not illustrated).

<Configuration of Substrate Holding Mechanism>

The substrate holding mechanism 3 is provided inside the vacuum container 1, and holds the plurality of substrates S so as to simultaneously form a film on each of the plurality of substrates S in a batch. As illustrated in FIGS. 1 and 3, the substrate holding mechanism is formed in a mountain shape in the side view and is formed in a round dome shape in the top view. The arrow of FIG. 3 indicates the rotation direction of a rotation member 60.

The substrate holding mechanism 3 includes annular substrate holding members 10, 20, 30, and 40 which are arranged in a concentric shape, a support member 50 which supports the substrate holding members 10, 20, 30, and 40, and the rotation member 60 which rotates the support member 50.

The rotation member 60 is formed as a known rotation motor and the like, and is provided at the center of the substrate holding mechanism 3. The rotation member 60 has a rotation axis X which is provided at the center of the substrate holding mechanism 3 so as to extend in the vertical direction.

When the rotation member 60 rotates about the rotation axis X serving as an axis, the support member 50 and the substrate holding members 10, 20, 30, and 40 rotate in the horizontal direction.

As illustrated in FIGS. 1 and 3, the support member 50 is formed in an elongated bar shape, where one end is fixed to the rotation member 60 and the other end is disposed at the lower side in relation to the rotation member 60.

A fixing plate 51a which fixes the substrate holding members 10, 20, 30, and 40 is attached to a part of the support member 50. The fixing plate 51a is made of metal, and includes a planar plate portion and a support member attachment portion which is continuous from the plate portion and is curved with respect to the plate portion. The angle which is formed between the plate portion and the support member attachment portion is equal to the angle which is formed between the support member 50 and the substrate holding members 10, 20, 30, and 40, and when the support member attachment portion is fixed to the support member 50 by bolt-threading, welding, or the like, the plate portion is configured to be parallel to the attachment surfaces of the substrate holding members 10, 20, 30, and 40.

When the support member attachment portion of the fixing plate 51a is attached to the support member 50 and the substrate holding members 10, 20, 30, and 40 are fixed by a bolt 51, the substrate holding members 10, 20, 30, and 40 are supported by the support member 50.

As illustrated in FIG. 1, the fixing plate 51a is provided in the support member 50 as many as the number of the substrate holding members 10, 20, 30, and 40 which are attached to the support member 50. In the embodiment, since the substrate holding members 10, 20, 30, and 40 are provided in four rows in total, four fixing plates 51a are provided in the support members 50.

The support members 50 are provided as many as the divided number of the substrate holding members 10, 20, 30, and 40, and are fixed to the rotation member 60 at the same angular interval about the rotation axis X. The rotation member 60 and the support member 50 have an umbrella frame shape as a whole. In the embodiment, five support members 50 are provided.

The end of the support member 50 near the rotation member 60 is fixed to the rotation member 60.

The substrate holding members 10, 20, 30, and 40 are members which hold the plurality of substrates S, and is made of aluminum which is easily processed and is comparatively light in weight.

As illustrated in FIG. 3, the substrate holding members 10, 20, 30, and 40 are formed in concentric annular shapes having different diameters.

The substrate holding members 10, 20, 30, and 40 are respectively divided as many as the number of the support members 50 in the circumferential direction, and are formed as assemblies of the holding jigs as many as the number of the support members 50. The plurality of holding jigs which constitute one substrate holding member are formed in the same shape.

In the embodiment, the substrate holding members 10, 20, 30, and 40 are respectively divided into five segments in the rotation direction of the rotation member 60, and may be divided into the other numbers. In this case, the substrate holding members 10, 20, 30, and 40 may be divided into two to twelve segments in the circumferential direction.

Since the substrate holding members 10, 20, 30, and 40 are divided in this way, the weight decreases compared to the case where the substrate holding members 10, 20, 30, and 40 are integrally formed with each other. The substrate holding members 10, 20, 30, and 40 are lifted in the state where the plurality of substrates S are placed thereon and are attached to the support member 50 by an operator. The operator may easily attach the substrate holding members 10, 20, 30, and 40 by decreasing the weight of the substrate holding members 10, 20, 30, and 40, therefore the operation efficiency is improved.

On the other hand, when the substrate holding members 10, 20, 30, and 40 are divided into segments more than twelve, the time necessary for the operation of fixing the substrate holding members 10, 20, 30, and 40 to the support member 50 increases, which is undesirable in that the operation efficiency is degraded. Further, when the respective substrate holding members 10, 20, 30, and 40 are seen as a whole, the portion where the substrates S do not overlap each other or the area of the thick portions 11*i*, 11*j*, and the like is wide. Accordingly, the number of the substrate S which may be loaded on the substrate holding members 10, 20, 30, and 40 decreases, and the number of the substrates S which may be processed in a batch decreases, thereby degrading the efficiency of the film forming operation.

<Configuration of Holding Jig>

The holding jigs 11 to 15 are elements which constitute the substrate holding member 10. That is, the substrate holding member 10 is divided into the holding jigs 11 to 15 which have a circular-arc shape in the plan view.

The substrate holding members 10, 20, 30, and 40 are different from each other in the diameter, but have the substantially same basic structure. Further, the holding jigs 11 to 15 are obtained by equally dividing the substrate holding member 10, and have the same configuration. Hereinafter, the holding jig 11 which constitutes the substrate holding member 10 will be described.

The holding jig 11 constitutes the substrate holding member 10 which is formed in an annular shape, and is formed in a circular-arc shape in the plan view. The plurality of substrates S are held by the substrate holding member 10 (the holding jig 11) when being placed on the holding jig 11. The holding jig 11 holds the plurality of substrates S in a manner that at least a part of the non-film forming portion S2 of the substrate S which are held so as to be adjacent to each other overlap each other and the film forming portion S1 is exposed.

As illustrated in FIG. 4, the holding jig 11 is a plate-shaped member which has a substantially U-shaped cross section, and includes a bottom plate portion 11*a* which is formed as a plate having two longitudinal sides curved along a concentric circular-arc about the rotation axis X, an inner upright wall portion 11*b* which is formed upright from the inner end of the bottom plate portion 11*a* in the radial direction, an outer upright wall portion 11*c* which is formed upright from the outer end of the bottom plate portion 11*a* in the radial direction, and thick portions 11*i* and 11*j* which are respectively provided in both ends of the bottom plate portion 11*a* in the circumferential direction.

The bottom plate portion 11*a* is provided with a lowermost substrate disposition portion 11A which is used to place the first substrate S on the holding jig 11 and a step portion 11B which is formed adjacent to the side in the counter-clockwise rotation direction in relation to the lowermost substrate disposition portion 11A and of which the bottom surface is formed in a step shape. Furthermore, the above counter-clockwise rotation direction can be the clockwise rotation direction. In this case, a mirror-image body of which all configurations are reversed is formed.

As illustrated in FIGS. 4 and 5, a predetermined gap is formed between the inner upright wall portion 11*b* and the portion including the lowermost substrate disposition portion 11A and the step portion 11B and a predetermined gap is formed between the outer upright wall portion 11*c* and the portion. The gaps are respectively formed as exhaust grooves 11*k* and 11*m*.

The lowermost substrate disposition portion 11A is formed as a region which is surrounded by the thick portion 11*j*, the end of the step portion 11B, a first wall portion 11*n* which is formed at the outside in the radial direction of the holding jig 11 in relation to the inner upright wall portion 11*b*, and a second wall portion 11*o* which is formed at the inside in the radial direction of the holding jig 11 in relation to the outer upright wall portion 11*c*.

The thick portion 11*j* is formed in the end of the holding jig 11 in the clockwise rotation direction about the rotation axis X, and is formed as a wall portion extending in the radial direction. In the thick portion 11*j*, a total of two exhaust grooves 11*jx* which extend in the substantially circumferential direction are provided at the inside and the outside of the radial direction. Each exhaust groove 11*jx* is formed as a concave portion to both ends of the thick portion 11*j* in the circumferential direction.

The holding jig 11 includes the exhaust grooves 11*k*, 11*m*, and 11*jx*. Accordingly, as illustrated in FIG. 7, air which is accumulated between the substrate S and the holding jig 11 in the state where the plurality of substrates S are placed on the holding jig may be smoothly eliminated, and hence the film forming operation may efficiently be performed.

The thick portion 11*j* is provided with a step 11*js* in which the inside of the holding jig 11 in the circumferential direction is low. The step 11*js* is inclined with respect to the end surface of the holding jig 11 in the clockwise rotation direction in a manner that the portion near the rotation axis X becomes closer to the same end surface. The step 11*js* may position the substrate S by coming into contact with the end of the substrate S.

The lowermost substrate disposition portion 11A is defined by the end of the step portion 11B. The end of the step portion 11B is a first step of the step portion 11B which is provided adjacent to the lowermost substrate disposition portion 11A, and is formed as a step of which the height is substantially equal to the thickness of the substrate S and of which the side near the step portion 11B is higher than the bottom surface of the lowermost substrate disposition portion 11A.

The first wall portion 11*n* is formed at the slight outer peripheral side of the inner upright wall portion 11*b*, that is, the inside of the holding jig 11, and extends in the substantially circumferential direction from the end of the thick portion 11*j* near the rotation axis X. The end of the first wall portion 11*n* near the thick portion 11*j* is formed so as to be slightly higher than the end of the lowermost substrate disposition portion 11A near the step portion 11B, and the first substrate S which is first installed on the holding jig 11 may be inclined in a manner that the portion near the thick portion 11*j* is slightly higher than the end near the step portion 11B.

The second wall portion 11*o* is provided on the slightly inner peripheral side of the outer upright wall portion 11*c*, that is, the inside of the holding jig 11, and extends in the substantially circumferential direction from the end of the thick portion 11*j* opposite to the rotation axis X.

In the second wall portion 11*o*, as illustrated in FIG. 4, a step portion 11*os* which increases in height at the side of the thick portion 11*j* is formed, and the substrate S may be positioned by bringing the end of the substrate S into contact with the step portion 11*os*.

The end of the second wall portion 11*o* near the thick portion 11*j* is formed so as to be slightly higher than the end of the lowermost substrate disposition portion 11A near the step portion 11B, and the first substrate S which is first installed on the holding jig 11 may be inclined in a manner that the portion near the thick portion 11*j* is slightly higher than the end near the step portion 11B.

Further, the bottom surface of the region which is surrounded by the thick portion 11*j* of the lowermost substrate disposition portion 11A, the end of the step portion 11B, the first wall portion 11*n*, and the second wall portion 11*o* includes a support surface 11*g*1 which comes into contact with the lower surface of the first substrate S that is first installed on the holding jig 11 so as to support the substrate S and a concave surface 11*g*2 which is formed so as to be lower than the support surface 11*g*1.

The support surface 11*g*1 is formed as an inclined surface of which the side near the thick portion 11*j* is slightly high. An opening portion 11*f* through which the film forming portion S1 of the first substrate S installed on the holding jig 11 is exposed to the film forming source 4 is provided at the center of the holding jig 11 in the radial direction at a position close to the end of the support surface 11*g*1 near the step portion 11B.

The concave surface 11*g*2 is formed at a position lower than the lower surface of the first substrate S which is first installed on the holding jig 11, and a space is formed between the concave surface 11*g*2 and the substrate S. The concave surface 11*g*2 is provided with a window portion 11*h* which is opened so as to measure a film thickness and the like.

The concave surface 11*g*2 serves to prevent the surface of the substrate S which is first placed on the holding jig 11 from being damaged by the friction against the thick portion 11*j*. Accordingly, it is possible to inhibit a decrease in the yield rate due to the damage of the substrate S and form a thin film with the higher efficiency.

The step portion 11B is a portion which stacks the second and subsequent substrates S installed on the holding jig 11 so as to slightly deviate from each other, and includes a plurality of holding surfaces 11*d* which supports the second and subsequent substrates S at a position in the vicinity of the film farming portion S1 and a step portion 11*e* which is formed between the holding surfaces 11*d*.

The holding surface 11*d* is a plane which extends throughout the entire length of the step portion 11B in the radial direction, and is formed between a pair of adjacent step portions 11*e*. The holding surface 11*d* is a surface which is parallel to the support surface 11*g*1, and is inclined in a manner that in a pair of adjacent step portions 11*e*, the portion of the holding surface near the step portion 11*e* between the holding surface 11*d* and the holding surface 11*d* which is higher by one level is at the lower level. The holding surface 11*d* extends from the inner peripheral end of the step portion 11B to the outer peripheral end, and is formed in a substantially rectangular shape, of which the inner peripheral side is slightly narrower than the outer peripheral side, in the plan view. The holding surfaces 11*d* are provided as many as the number which is smaller by one than the number of the substrates S provided in the holding jig 11.

In the holding surface 11*d*, the opening portion 11*f* which is formed in a true circular shape in the plan view is formed so as to expose the film forming portion S1 of the substrate S to the film forming source 4. The opening portions 11*f* are arranged in a circular-arc shape which is concentric to the inner upright wall portion 11*b* and the outer upright wall portion 11*c*. Furthermore, the shape of the opening portion 11*f* is defined depending on the shape of the film forming portion S1 of the substrate S, and may be, of course, formed in a shape other than a true circular shape.

Since the opening portion 11*f* is formed in the holding surface 11*d* of the holding jig 11 in this way, the holding jig 11 serves as a mask. Accordingly, there is no need to provide a member which covers the substrate S other than the holding jig 11. Further, since the shape of the opening portion 11*f* may be appropriately changed, the shape and the size of the film forming portion S1 may be precisely and easily controlled.

The step portions 11*e* are used to respectively position the second and subsequent substrates S installed on the holding jig 11 by being brought into contact with the end of the substrate in the counter-clockwise rotation direction, and is formed between a pair of adjacent holding surfaces 11*d*. The step portion 11*e* is formed as a step of which the side in the clockwise rotation direction is low. The step portion 11*e* extends in a straight line shape in the plan view from the inner peripheral end of the step portion 11B to the outer peripheral end thereof.

The holding surface 11*d* and the step portion 11*e* which are provided in the holding jig 11 are alternately and continuously provided, where the holding surface 11*d* is slightly inclined with respect to the horizontal surface in a manner that one end side is higher than the other end side and the step portion 11*e* is formed so as to decrease in height by one level from the high portion of the holding surface 11*d*. Since the distance between the opening portion 11*f* formed in the holding surface 11*d* and the film forming source 4 may be made to be uniform, the film forming operation may be performed on the plurality of substrates S with the same condition, and hence the film forming operation may be performed with a uniform film thickness.

As illustrated in FIG. 5, the step portion 11*e* is inclined at a certain angle with respect to the radial direction R-R.

The height of the step portion 11*e* is formed so as to be higher by 0.05 mm or more than the thickness of the substrate S. More specifically, the step portion 11*e* is formed so as to be higher than the thickness of the substrate S in the range of 0.05 mm to 0.1 mm, inclusive.

Since the step portion 11*e* is formed so as to be slightly higher than the thickness of the substrate S in this way, the end of the substrate S may easily be brought into contact with the step portion 11*e*. In addition, when the substrate S is held by the holding surface 11*d*, the overlapping substrates S may overlap each other with a slight gap therebetween due to the height of the step portion 11*e*. For this reason, the surfaces of the substrates S do not easily come into contact with each other, and hence the damage of the surface of the substrate S due to the friction may be inhibited.

When a difference between the height of the step portion 11e and the thickness of the substrate S is smaller than 0.05 mm, the substrates S may easily come into contact with each other. For this reason, this difference is undesirable. Further, when a difference between the height of the step portion 11e and the thickness of the substrate S is larger than 0.1 mm, a uniform thin film may not be easily formed on the plurality of substrates S. For this reason, this difference is undesirable.

As illustrated in FIG. 7, attachment holes 11p and 11q are respectively formed at four positions in total, that is, both radial ends of both circumferential ends of the holding jig 11 so as to attach the holding jig 11 to the fixing plate 51a of FIG. 1.

The film forming source 4 is formed as a general depositing device, where a plurality of cylindrical hearth liners are provided and the hearth liners are arranged in a concentric recess of a disk-shaped hearth. The film forming source 4 is disposed at the lower side in the vacuum container 1, and emits a thin film material toward the substrate S. In FIG. 1, for convenience of description, only one hearth liner is illustrated as the film forming source 4.

The film forming source 4 is not limited to a device which evaporates a thin film material by an electron gun, and for example, a device which evaporates a thin film material by resistance-heating may be adopted. Further, the number or the arrangement of the film forming sources 4 may be appropriately changed in accordance with the type or the number of the films formed on the substrates S.

Further, for example, when a deposition is performed by an ion assisting technique, the following components may be provided, such as an ion source which emits positive ions toward the substrate S and a neutralizer which emits an electron beam to the substrate S or the substrate holding mechanism 3 charged positively so as to neutralize charges.

Since the temperature of the film forming source 4 is very high during the film forming operation, a general substrate cooling unit may be provided around the substrate holding mechanism 3 so as to inhibit the substrate S from being deformed due to heating. The substrate cooling unit is particularly effective when the substrate S is made of resin.

Furthermore, the thin film forming apparatus 100 of the embodiment is an apparatus which forms a thin film by a vacuum depositing technique, but the invention may be applied to a sputtering device.

<Configuration of Substrate>

As illustrated in FIG. 2, the substrate S is formed in a rectangular shape of which four corners are formed in a round shape in the plan view, and includes a film forming portion S1 having a thin film to be formed on the lower surface thereof and a non-film forming portion S2 having no thin film to be formed thereon.

The film forming portion S1 is formed around one short edge among two facing short edges of the substrate S so as to be away from the one short edge to the slightly inner side, and is formed at the center in the direction perpendicular to the longitudinal direction of the substrate S. In the embodiment, an example is illustrated in which the film forming portion S1 has a true circular shape, but may have the other shapes.

The substrate S is a glass plate having a thickness of about 0.3 to 0.5 mm, and a thin film may be formed in advance on the surface thereof for the purpose of a decoration or the like by a technique such as printing. Furthermore, in the specification, the "film forming portion S1" indicates a specific region in which a thin film is formed by the thin film forming apparatus 100, and does not indicate a portion in which a thin film is formed in advance.

Further, in the embodiment, the substrate S is formed in a rectangular planar shape, but the invention is not limited thereto. The shape may be, of course, modified variously.

<Setting of Substrate>

The substrates S are installed on the holding jig 11 as many as the number of the step portions 11e.

As illustrated in FIG. 6, the first substrate S is disposed in a manner that one short edge comes into contact with the step 11js, the other short edge comes into contact with the step portion 11e which is present at the farthest side in the clockwise rotation direction, the center of one long edge comes into contact with the inner surface of the inner upright wall portion 11b in the radial direction of the holding jig 11, and both ends of the other long edge come into contact with the outer surface of the outer upright wall portion 11c in the radial direction of the holding jig 11. At this time, the substrate S is inclined in a manner that the end near the step portion 11e is lower than the end near the step 11js.

As illustrated in FIG. 7, the second and subsequent substrates S are sequentially installed so as to partially overlap the precedent installed substrate S.

The second and subsequent substrates S are disposed in a manner that one short edge is disposed at a position deviated in the counter-clockwise rotation direction by a distance between the adjacent step portions 11e on the precedent installed substrate S, the other short edge comes into contact with the step portion 11e, the center of one long edge comes into contact with the inner surface of the inner upright wall portion 11b in the radial direction of the holding jig 11, and both ends of the other long edge come into contact with the outer surface of the outer upright wall portion 11c in the radial direction of the holding jig 11.

In the substrate S which is installed finally, the edge which is present in the counter-clockwise rotation direction among the short edges comes into contact with the thick portion 11i.

In this way, the ends of the substrate S are held by being coming into contact with the step portion 11e, the inner upright wall portion 11b, the outer upright wall portion 11c, the step 11js, and the thick portion 11i. For this reason, the substrate S is easily and stably fixed onto the holding jig 11, so that the holding position will not deviate.

As illustrated in FIGS. 8 and 9, the substrate S which is held in this way is inclined in a manner that the end near the step portion 11e is lower than the other end.

In the plurality of installed substrates S, the lower surface of the portion which does not overlap the precedent installed substrate S comes into contact with the holding surface 11d, and the lower surface of the substrate S is exposed to the lower side of the holding jig 11 from the opening portion 11f provided in the holding surface 11d. The exposed portion as the film forming portion S1 is subjected to the film forming operation using the film forming source 4.

One substrate S is held by one holding surface 11d. When the substrates S sequentially overlap each other on the holding jig 11, the plurality of substrates S partially overlap each other, and are held while the other portions are deviated from each other.

The area of the holding surface 11d is formed so as to be smaller than the area of the substrate S, and the holding jig 11 holds the substrate S in a manner that the non-film forming portions S2 of the adjacent substrates S overlap each other.

In the adjacent substrates S, the short edges in the same direction are not parallel to each other, and have an angle of 0° to 90°. The holding jig 11 is curved in a circular-arc shape, and hence the more substrates S may be held by the substrate holding member 10 with such a configuration.

The rectangular substrate S is held by the holding jig 11 so as to satisfy the following relation. In FIG. 7, when the length of the inner long edge of the long edges of the rectangular substrate S in the radial direction is denoted by L and the distance from the center point of the long edge to the rotation axis X as the center point of the circular-arc depicted by the holding jig 11 is denoted by r, the holding jig 11 is formed in a manner that the length of the half of the length L with respect to the distance r, that is, (L/2)/r (the value of tan θ1 in θ1 to be described later) is 0.05 to 0.75, inclusive.

In other words, as illustrated in FIG. 7, when the angle formed between the line which passes the center point of the inner long edge of the substrate S in the radial direction and the rotation axis X and the line which passes the apex disposed at the inside in the radial direction among the apexes of the substrate S and the rotation axis X is denoted by θ1, θ1 is 2.9° to 36.9°, inclusive. Furthermore, the angle θ1 is an acute angle formed between the line which passes the center point of the inner long edge in the radial direction and the rotation axis X and the line which passes the inner apex in the radial direction among the apexes of the substrate S and the rotation axis X.

In addition to the holding jigs 11 to 15 which constitute the substrate holding member 10, all holding jigs which constitute the substrate holding members 20, 30, and 40 having different diameters are formed so as to satisfy this relation. Accordingly, the substrate holding members 10, 20, 30, and 40 may hold the plurality of substrates S. When the values of tan θ1 and θ1 are set as the above-described relation, a large number of substrates S may be simultaneously processed, and hence the film forming operation may be performed with extremely high efficiency.

The holding jigs 11 to 15 and the respective holding jigs constituting the substrate holding members 20, 30, and 40 are installed as illustrated in FIGS. 1 and 3 by bolt-fixing with the bolt 51 to the plate portion of the fixing plate 51a which is attached to the support member 50.

In this case, the substrate holding members 10, 20, 30, and 40 are formed in an annular shape, and are supported by the support member 50 in a manner that the centers thereof are present on the rotation axis X of the rotation member 60. The substrate holding members 10, 20, 30, and 40 are supported by the support member 50 so as to decrease in height in order of the substrate holding members 40, 30, 20, and 10 from the innermost substrate holding member 40 to the outside.

The substrate holding members 10, 20, 30, and 40 having different diameters are arranged in a step shape so as to partially overlap each other in the vertical direction. The inner ends of the substrate holding members 10, 20, and 30 are disposed at the inside in the radial direction in relation to the outer ends of the substrate holding members 20, 30, and 40 respectively disposed at the inside of the substrate holding members 10, 20, and 30 by one level.

Furthermore, in the embodiment, a configuration is exemplified in which four substrate holding members are provided in the radial direction as the substrate holding members 10, 20, 30, and 40, but a different number of substrate holding members may be arranged. In this way, when a plurality of substrate holding members are arranged in the radial direction so as to be adjacent to each other, the number of the substrates S on which films are formed may be increased, and hence the film forming operation may efficiently be performed.

<Positional Relation Among Substrate Holding Members>

Referring to FIG. 10, the relative positional relation between the substrate holding members 10, 20, 30, and 40 will be described. FIG. 10 is a diagram illustrating the positional relation between the film forming source 4 and the support member 50 to which the substrate holding members 10, 20, 30, and 40 are fixed.

In the substrate holding members 10, 20, 30, and 40, the substrate holding mechanism 3 is formed in a dome shape, and is formed in a manner that the diameter thereof increases as much as the diameter of the substrate holding member disposed therebelow. The opening portions 11f, 21f, 31f, and 41f through which the film forming portion S1 of the substrate S is exposed are positioned on the surface of the imaginary dome in which the rotation axis X of the rotation member 60 is set to the axis, and hence a thin film having a uniform thickness may be formed on the substrate S.

Furthermore, in FIG. 10, an example is described in which the imaginary dome loading the opening portions 11f, 21f, 31f, and 41f is formed in a truncated cone shape, but the opening portions 11f, 21f, 31f, and 41f may be arranged on the surface of the semi-spherical dome having a predetermined curvature.

Further, the holding surfaces (11d and the like) of the substrate holding members 10, 20, 30, and 40 are not limited to the horizontal state, and the angle which is formed between the holding surfaces (11d and the like) and the rotation axis X may be adjusted. Furthermore, in FIG. 10, a configuration is illustrated in which the angle formed between the rotation axis X and the holding surface 11d of only the substrate holding member 10 is adjustable, but the angles of the substrate holding members 20, 30, and 40 may also be adjusted in the same way.

In this case, an angle θ2 formed between a first imaginary line V1 which passes the center point of the film forming portion S1 of the substrate S and the end of the hearth liner of the film forming source 4 and a perpendicular line P of the center point of the film forming portion S1 may be an acute angle of 0° to 45°, inclusive. Furthermore, in FIG. 10, for simplicity of description, only the substrate S which is placed so as to face the opening portion 11f is illustrated among the plurality of substrates S provided on the substrate holding member 10.

When the angle θ2 is larger than 45°, the thin film material is obliquely applied to the film forming portion S1, and hence the density of the formed thin film decreases, which decreases the refractive index of the thin film. As a result, it is difficult to obtain a desired spectral characteristic in the thin film formed on the substrate S.

When the angle θ2 is set to be 0° to 45°, inclusive, the thickness of the thin film formed on the substrate S may easily be controlled, and a thin film having a uniform film thickness may be formed on the plurality of substrates.

Furthermore, in FIG. 10, a configuration is illustrated in which only the substrate holding member 10 is disposed in a manner that the holding surface 11d is inclined with respect to the horizontal plane, but of course, the other substrate holding members 20, 30, and 40 may also be disposed in an inclined state.

The opening portion 21f, 31f, and 41f of the substrate holding members 20, 30, and 40 disposed at the inside in the radial direction are disposed at the inside in relation to at least the inner radial ends of the substrate holding members 10, 20, and 30 which are disposed at the outside in the radial direction so as to be adjacent to each other.

Then, the substrate holding members 20, 30, and 40 and the substrate holding members 10, 20, and 30 which are arranged so as to be adjacent to each other in the radial direction are arranged at positions where the opening portions 21f, 31f, and 41f formed in the inner substrate holding members 20, 30, and 40 are not shielded by the inner radial ends of the outer substrate holding members 10, 20, and 30 with respect to the film forming source 4. With this configuration, the film thickness of the thin film which is formed on the substrate S may be made uniform.

More specifically, the substrate holding members 20, 30, and 40 and the substrate holding members 10, 20, and 30 which are arranged so as to be adjacent to each other in the radial direction are arranged at positions where the inner radial ends of the outer substrate holding members 10, 20, and 30 are away by 20 mm or more from a second imaginary line V2 which passes the film forming source 4 and the outer peripheral ends of the opening portions 21f, 31f, and 41f formed in the inner substrate holding members 20, 30, and 40 in the side view. Furthermore, in FIG. 10, the imaginary lines V2 and V3 are depicted only for the substrate holding members 20 and 30.

That is, in FIG. 10, in the substrate holding members 20, 30, and 40 and the substrate holding members 10, 20, and 30 which are arranged so as to be adjacent to each other in the radial direction, when the line which passes the outer ends of the opening portions 21f, 31f, and 41f of the substrate holding members 20, 30, and 40 arranged at the inside in the radial direction of the substrate holding members 20, 30, and 40 and the outer end of the film forming source 4 in the radial direction of the hearth liner is set to the imaginary line V2 and the line which is parallel to the imaginary line V2 and passes the upper ends of the inner upright wall portions 11b and the like of the substrate holding members 10, 20, and 30 disposed at the outside of the substrate holding members 20, 30, and 40 is set to the imaginary line V3, the distance I between the imaginary line V2 and the imaginary line V3 may be 20 mm or more.

In the substrate holding mechanism 3 in which the substrate holding members 10, 20, 30, and 40 having different diameters are arranged in a concentric shape, the thickness of the film formed on the substrate S is easily influenced by the substrate holding members 10, 20, 30, and 40 which are arranged so as to be adjacent to each other. However, due to this configuration, the thickness of the formed film is not easily influenced by the outer substrate holding members 10, 20, and 30, and hence the film thickness may be made to be further uniform.

The procedure of placing the substrate S on the holding jig 11 is as follows.

First, the first substrate S is disposed in a manner that the first substrate S covers the concave surface 11g2 and in a manner that one short edge comes into contact with the step 11js of the thick portion 11j while the other short edge comes into contact with the step portion 11e which is closest to the thick portion 11j.

Next, the second substrate S overlaps the first substrate S, and the end of the short edge present at the side in the counter-clockwise rotation direction comes into contact with the step portion 11e present at the side in the counter-clockwise rotation direction in the vicinity of the step portion 11e with which the first substrate S comes into contact. At this time, the film forming portion S1 of the second substrate S does not overlap the first substrate S, and the non-film forming portion S2 of the second substrate S overlaps the first substrate S.

The plurality of substrates S are sequentially placed on the holding jig 11 according to the above-described procedure, and in the state of FIGS. 7 to 9, the holding jig 11 is fixed to the fixing plate 51a by the bolt 51. Accordingly, attachment of the holding jig 11 to the support member 50 is complete. According to the same procedure, the holding jigs 12 to 15 are attached to the support members 50 of the substrate holding members 20, 30, and 40. Accordingly, the substrates S are placed on the respective substrate holding members 10, 20, 30, and 40 of the substrate holding mechanism 3 of FIG. 3.

Subsequently, the substrate holding mechanism 3 on which the substrate S is placed is introduced into the vacuum container 1, and the thin film forming operation is performed.

In this way, since the holding jig 11 may hold the substrate in the state where only the film forming portion S1 is exposed to the film forming source 4, a large number of substrates S each having the film forming portion S1 and the non-film forming portion S2 may be simultaneously produced. Accordingly, the time necessary for the film forming operation may be shortened, and cost for the film forming operation may be decreased.

EXAMPLE

Example 1 and Comparative Examples 1 and 2

A reflection preventing film (AR film) was prepared by holding the substrate S using the substrate holding mechanism 3 having the above-described configuration and stacking thin films having different refractive indexes, and the effect of the distance I was evaluated.

Furthermore, the film forming condition of each of respective layers constituting the reflection preventing film is as below, and the same applies to Example 1 and Comparative Examples 1 and 2.

Substrate: glass substrate
High-refractive dielectric material: $TiO_2$
Low-refractive dielectric material: $SiO_2$
Film forming speed of $TiO_2$: 0.2 nm/sec
Film forming speed of $SiO_2$: 0.3 nm/sec
Ion source operating condition during evaporation of $TiO_2$/$SiO_2$
   Introduction gas: oxygen 50 sccm
   Ion acceleration voltage: 1000 V
   Ion current: 500 mA
Condition of neutralizer
   neutralizer current: 1000 mA The reflection preventing film was formed according to the above film forming condition, and the reflectances of the reflection preventing films were compared with each other between the cases where the adjacent substrate holding member was present and the adjacent substrate holding member was absent when the distance I between the imaginary line V2 and the imaginary line V3 was set to 20 mm (FIG. 11: Example 1), 5 mm (FIG. 12: Comparative Example 1), and 10 mm (FIG. 13: Comparative Example 2).

Example 1

In the case where the distance I was set to 20 mm (FIG. 11), a large difference in the reflectance of the reflection preventing film was not found between the cases where the adjacent substrate holding member was present and the adjacent substrate holding member was absent. Furthermore, in FIG. 11, the "case where the adjacent substrate holding member was present" indicated by the solid line indicates a state where one substrate holding members were disposed in a manner that the distance I was 20 mm with respect to the other substrate holding member among the substrate holding members arranged so as to be adjacent to each other in the radial direction.

There is a tendency that the reflection preventing effect of the reflection preventing film, that is, the reflectance depends on the thickness of the reflection preventing film. Accordingly, as illustrated in FIG. 11, when the substrate holding member is disposed in a manner that the distance I becomes 20 mm, it is found that a thin film having a uniform film thickness may be formed in the state where the thin film to be formed is not influenced by the adjacent substrate holding member.

(Comparative Example 1)

In the case where the distance I was set to 5 mm (FIG. 12), a large difference in the reflectance of the formed reflection preventing films was found between the cases where the adjacent substrate holding member was present and the adjacent substrate holding member was absent. Furthermore, in FIG. 12, the "case where the adjacent substrate holding member was present" indicated by the solid line indicates a state where one substrate holding member was disposed in a manner that the distance I was 5 mm with respect to the other substrate holding member among the substrate holding members arranged so as to be adjacent to each other in the radial direction.

There is a tendency that the reflection preventing effect of the reflection preventing film, that is, the reflectance depends on the thickness of the reflection preventing film. Accordingly, as illustrated in FIG. 12, when the substrate holding member is disposed in a manner that the distance I is 5 mm, it is found that the thin film to be formed is influenced by the adjacent substrate holding member.

(Comparative Example 2)

Further, in Comparative Example 2 of the present invention illustrated in FIG. 13, the distance I was set to 10 mm. In Comparative Example 2, even when the case where the adjacent substrate holding member was present and the case where the adjacent substrate holding member was absent were compared with each other in the state where the distance I was 10 mm, a slight difference was found in the reflectance of the formed reflection preventing film. Furthermore, the "case where the adjacent substrate holding member is present" indicates a state where one substrate holding member is disposed in a manner that the distance I is 10 mm with respect to the other substrate holding member among the substrate holding members adjacent to each other in the radial direction.

Also in FIG. 13, a case is illustrated in which the formed thin film is influenced by the adjacent substrate holding member when the substrate holding member is disposed in a manner that the distance I is 10 mm.

Accordingly, it is found that the adjacent substrate holding members 10, 20, 30, and 40 influence the film thickness of the thin film to be formed when the distance I is at least from 5 mm to 10 mm. Further, it is found that the influence of the adjacent substrate holding members 10, 20, 30, and 40 on the thin film decreases as the distance I increases. Accordingly, in the case where the distance I is larger than 10 mm, it is expected that an influence on the thin film decreases.

When the distance I is set to 20 mm as illustrated in Example 1, it is found that the adjacent substrate holding members 10, 20, 30, and 40 hardly influence the film thickness of the formed thin film.

Accordingly, when the radial ends of the adjacent substrate holding members are disposed so as to be away from each other by 20 mm or more with respect to the distance I, the reflectance and the film thickness of the thin film formed on the substrate S may be made uniform.

<Other Embodiments>

Next, the substrate holding mechanism according to the other embodiments will be described.

The substrate holding mechanism of the embodiment includes the rotation member 60 and the support member 50 illustrated in FIGS. 1 to 10 and a substrate holding member. Since the rotation member 60 and the support member 50 are common to those of the embodiment of FIGS. 1 to 10, the description thereof will not be repeated.

The substrate holding member is used instead of the substrate holding members 10, 20, 30, and 40, and a substrate holding member 10' which is fixed to the outermost side of the support member 50 is illustrated in FIG. 14.

The substrate holding member 10' is formed as a substantially fan-shaped plate in the plan view, and is configured to fix holding jigs 11' to 13' onto the plate.

In the substrate holding member 10', a portion provided with at least an opening portion 11f' in the portion attached with the holding jig 11' is opened in a manner that the film forming portion S1 of the substrate S is exposed. The substrate holding member 10' includes a bolt hole 10h' which is used to fasten a bolt to a fixing plate (not illustrated) attached to the support member 50.

As illustrated in FIG. 15, the holding jig 11' is formed as a plate which has a substantially rectangular shape in the plan view and a substantial U-shape in the cross section. The ends of a pair of long edges of the holding jig 11' are provided with a frame 11r' which is thicker than the inner portion, and come into contact with the ends of the pair of long edges of the substrate S, thereby inhibiting the substrate S from coming off from the holding jig 11' in the short edge direction.

The holding jig 11' includes a plurality of holding surfaces 11d' which hold the substrate S, a plurality of step portions 11e' which are formed between the plurality of holding surfaces 11d' and respectively come into contact with the ends of the short edges of the substrate S, and an opening portion 11f' which is formed at a portion corresponding to the film forming portion S1 of the holding surface 11d' when the end of the substrate S is held by coming into contact with the step portion 11e'.

The holding jig 11' includes the plurality of holding surfaces 11d' which hold the substrate S. Then, a step portion 11e' is formed between the adjacent holding surfaces 11d'.

The plurality of holding surfaces 11d' and the plurality of step portions 11e' are formed in a step shape in the cross-sectional view, and one substrate S is held by one holding surface 11d'. Accordingly, when the substrates S sequentially overlap each other on the holding jig 11', the plurality of substrates S are held in a state where the substrate S partially overlaps each other while the other portions deviate from each other.

The step portions 11e' are parallel to each other and the end of the short edge of the substrate S comes into contact with the step portion 11e', thereby holding the plurality of substrates S in a linear shape.

Accordingly, since the ends of the substrate S are held by respectively coming into contact with the step portion 11e' and the frame 11r', the substrate S is easily and stably fixed onto the holding jig 11', and the holding position does not deviate.

The height of the step portion 11e' may be formed so as to be slightly higher than the thickness of the substrate S. With this configuration, it is possible to inhibit the surface of the substrate S from being damaged even when the plurality of substrates S overlap each other.

The holding surface 11d' is provided with the opening portion 11f' through which the film forming portion S1 of the substrate S is exposed to the film forming source 4. The opening portion 11f' is formed as an elongated hole which is integrally formed in the plurality of holding surfaces 11d'. However, the opening portion 11f' may not be an elongated hole, and may be separately formed in each of the holding surfaces 11d'.

At one end of the holding jig 11' in the longitudinal direction, a plane portion 11s' of which the surface attached with the substrate S is formed in a planar shape is provided at a position near the rotation axis X during the assembly of the substrate holding member 10'.

The plane portion 11s' supports the non-film forming portion S2 of the substrate S which is first disposed on the holding jig 11'.

Since the holding jigs 12' and 13' have the same configuration as that of the holding jig 11', the description thereof will not be repeated.

In the embodiment, the plural holding jigs 11', 12', and 13' are disposed on the substrate holding member 10' in a manner that a maximum-possible wide area is covered and the opening portions 11f' do not overlap each other.

The substrate holding members 10' to which the holding jigs 11' to 13' are fixed are used as many as the number of the support members 50. The substrate holding members 10' which are provided as many as the number of the support members 50 are bolt-fixed to a fixing plate (not illustrated) in the bolt hole 10h', and are provided and fixed between the support members 50 illustrated in FIGS. 1 to 10 so as to be supported in a dome shape as a whole.

In the embodiment, since five support members 50 are installed, five substrate holding members 10' are installed, but the substrate holding members may be provided as many as other numbers.

The procedure of placing the substrate S on the holding jig 11' is as follows.

First, the first substrate S is placed on the plane portion 11s' in a manner such that the end of one short edge comes into contact with the step portion 11e' which is formed at a position nearest the plane portion 11s'.

Next, the second substrate S overlaps the first substrate S, and the end of one short edge of the second substrate S comes into contact with the step portion 11e' adjacent to the step portion 11e' with which the first substrate S comes into contact. At this time, the second film forming portion S1 of the substrate S does not overlap the first substrate S, and the non-film forming portion S2 of the second substrate S overlaps the other substrate S.

The third and subsequent substrates S are sequentially placed on the holding jig 11' according to the same procedure, and the holding jig 11' is fixed to a fixing plate (not illustrated) by fastening a bolt (not illustrated) into the bolt hole 10h'. Accordingly, attachment of the first holding jig 11' to the support member 50 is complete. According to the same procedure, the other four holding jigs 11' are attached to the support member 50. Accordingly, five holding jigs 11' are attached between five support members 50, and are formed in an umbrella shape as a whole.

Subsequently, the substrate holding mechanism 3 on which the substrate S is placed is introduced into the vacuum container 1, and the thin film forming operation is performed.

REFERENCE NUMERALS

100: thin film forming apparatus
1: vacuum container
2: vacuum pump
3: substrate holding mechanism
4: film forming source
10, 20, 30, 40, 10': substrate holding member
  10h': bolt hole
11, 12, 13, 14, 15, 11', 12', 13': holding jig
  11A: lowermost substrate disposition portion
  11B: step portion
  11a: bottom plate portion
  11b: inner upright wall portion
  11c: outer upright wall portion
  11d, 11d': holding surface
  11e, 11e': step portion
  11f, 21f, 31f, 41f, 11f': opening portion
  11g1: support surface
  11g2: concave surface
  11h: window portion
  11i, 11j: thick portion
  11k, 11m: exhaust groove
  11js: step
  11jx: exhaust groove
  11n: first wall portion
  11o: second wall portion
  11os: step portion
  11p, 11q: attachment hole
  11r': frame
  11s': plane portion
50: support member
51: bolt
51a: fixing plate
60: rotation member
I: distance
P: perpendicular line
S: substrate
  S1: film forming portion
  S2: non-film forming portion
V1, V2, V3: imaginary line
X: rotation axis (central axis)

What is claimed is:

1. A thin film forming apparatus, for forming a thin film on each of a plurality of substrates, comprising:
  a substrate holder which holds the plurality of substrates,
  a supporter which supports the substrate holder, and
  a rotator which rotates the supporter,
  wherein the substrate holder is formed in an annular shape in a plan view, and comprises a plurality of holding jigs formed in a circular-arc shape in a plan view,
  wherein each of the holding jigs comprises a bottom plate portion having longitudinal sides curved along a concentric circular-arc about a rotation axis of the rotator, an inner upright wall portion protruding upright from an inner end side of the bottom plate portion and having a surface curved along the concentric circular-arc about the rotation axis of the rotator, and an outer upright wall portion protruding upright from an outer end side of the bottom plate portion and having a surface curved along the concentric circular-arc about the rotation axis of the rotator, wherein the bottom plate portion comprises:
a stairs portion of which the bottom surface is formed in a stairs shape along the circumference of the substrate holder,
wherein the stairs portion comprises:
a plurality of holding surfaces which holds the plurality of substrates and is disposed between a film forming source emitting a material of the thin film and the plurality of substrates,
a plurality of step portions which is formed between the plurality of holding surfaces, and
a plurality of opening portions each of which is formed in each of the plurality of holding surfaces, and
wherein the plurality of step portions are configured to contact with an end of each of the plurality of substrates,
wherein the inner upright wall and the outer upright wall are configured that the curved surface of the inner upright wall contacts with one point of an inner surface of each of the plurality of substrates, or that the curved surface of the outer upright wall contacts with two points of an outer surface of each of the plurality of substrates,
wherein when ends of the plurality of substrates respectively come into contact with the step portions in a state where a part of a non-film forming portion on which the thin film is not to be formed in each of the plurality of substrates overlaps other one of the plurality of substrates and a film forming portion on which the thin film is to be formed is exposed, the plurality of substrates are loaded in a manner that the film forming portion is exposed to the film forming source through the opening portion.

2. The thin film forming apparatus according to claim 1, wherein the substrate holder is divided into two to twelve segments in a rotation direction of the rotator.

3. The thin film forming apparatus according to claim 1, wherein a plurality of the substrate holders are provided, each of the plurality of substrate holders is formed in an annular shape in a plan view, and the plurality of substrate holders are disposed so as to be adjacent to each other in a radial direction of each of the plurality of substrate holders.

4. The thin film forming apparatus according to claim 1, wherein the supporter holds the substrate holder in a manner that an angle formed between the plurality of holding surfaces of the substrate holder and a rotation axis of the rotation member is adjustable.

5. The thin film forming apparatus according to claim 1, wherein the substrate holder holds the plurality of substrates in a manner that an angle formed between a first imaginary line passing the film forming portion and the film forming source and a perpendicular line with respect to a film forming surface of the film forming portion is 0° to 45°, inclusive.

6. The thin film forming apparatus according to claim 1, wherein the supporter supports the substrate holder in a manner that the plurality of opening portions formed in the plurality of holding surfaces are positioned on an imaginary dome surface in which a rotation axis of the rotator serves as a central axis.

7. The thin film forming apparatus according to claim 3, wherein the plurality of substrate holders which are arranged so as to be adjacent to each other in the radial direction are arranged at positions where the opening portion formed in one of the plurality of substrate holders with respect to the film forming source is not shielded by other one of the plurality of substrate holders.

8. The thin film forming apparatus according to claim 3, wherein the supporter supports the plurality of substrate holders arranged in at least any one of a rotation direction and the radial direction, and
wherein the plurality of substrate holders which are arranged so as to be adjacent to each other in the radial direction are arranged at positions where a radial end of one of the plurality of substrate holders is away by 20 mm or more from a secondary imaginary line passing the film forming source and an outer periphery of the opening portion formed in the holding surface of other one of the plurality of substrate holders.

9. The thin film forming apparatus according to claim 3, wherein the plurality of step portions is formed in an inclined direction with respect to the radial direction, and
wherein the plurality of substrates is formed as a rectangular plate, and when lengths of inner radial edges of the plurality of substrates are respectively denoted by L and the distance from the center points of the respective edges of the plurality of substrates to a rotation axis of the rotator are denoted by r, the substrate holder holds the plurality of substrates in a manner that a value of (L/2)/r is 0.05 to 0.75, inclusive.

10. The thin film forming apparatus according to claim 9, wherein each of the substrate holders holds the plurality of substrates in a manner that an angle formed between an edge of one of the plurality of substrates and an edge of other one of the plurality of substrates overlapping each other is 0° to 90°, inclusive.

11. The thin film forming apparatus according to claim 1, wherein heights of the plurality of step portions are formed so as to be higher by 0.05 mm or more than thicknesses of the plurality of substrates.

12. The thin film forming apparatus according to claim 2, wherein a plurality of the substrate holders are provided, each of the plurality of substrate holders is formed in an annular shape in a plan view, and
the plurality of substrate holders are disposed so as to be adjacent to each other in a radial direction of each of the plurality of substrate holders.

13. The thin film forming apparatus according to claim 12, wherein the plurality of substrate holders which are arranged so as to be adjacent to each other in the radial direction are arranged at positions where the opening portion formed in one of the plurality of substrate holders with respect to the film forming source is not shielded by other one of the plurality of substrate holders.

14. The thin film forming apparatus according to claim 12, wherein the supporter supports the plurality of substrate holders arranged in at least any one of the rotation direction and the radial direction, and
wherein the plurality of substrate holders which are arranged so as to be adjacent to each other in the radial direction are arranged at positions where a radial end of one of the plurality of substrate holders is away by 20 mm or more from a secondary imaginary line passing the film forming source and an outer periphery of the opening portion formed in the holding surface of other one of the plurality of substrate holders.

15. The thin film forming apparatus according to claim 12, wherein the plurality of step portions is formed in an inclined direction with respect to the radial direction, and
wherein the plurality of substrates is formed as a rectangular plate, and when lengths of inner radial edges of the plurality of substrates are respectively denoted by L and the distance from the center points of the respective edges of the plurality of substrates to a rotation axis of the rotator are denoted by r, the substrate holder holds the plurality of substrates in a manner that a value of (L/2)/r is 0.05 to 0.75, inclusive.

16. The thin film forming apparatus according to claim 15, wherein each of the substrate holders holds the plurality of substrates in a manner that an angle formed between an edge of one of the plurality of substrates and an edge of other one of the plurality of substrates overlapping each other is 0° to 90°, inclusive.

17. The thin film forming apparatus according to claim 1, wherein the step portions are inclined with respect to a radial direction of the substrate holder.

* * * * *